(12) United States Patent
Ejiri

(10) Patent No.: US 6,770,974 B2
(45) Date of Patent: Aug. 3, 2004

(54) SEMICONDUCTOR DEVICE AND ITS MANUFACTURING METHOD

(75) Inventor: Hirokazu Ejiri, Tokyo (JP)

(73) Assignee: Sony Corporation, Tokyo (JP)

( * ) Notice: Subject to any disclaimer, the term of this patent is extended or adjusted under 35 U.S.C. 154(b) by 46 days.

(21) Appl. No.: 10/069,901

(22) PCT Filed: Jun. 29, 2001

(86) PCT No.: PCT/JP01/05663
§ 371 (c)(1),
(2), (4) Date: Jul. 1, 2002

(87) PCT Pub. No.: WO02/03458
PCT Pub. Date: Jan. 10, 2002

(65) Prior Publication Data
US 2002/0180053 A1 Dec. 5, 2002

(30) Foreign Application Priority Data
Jun. 30, 2000 (JP) ........................................ 2000-199309

(51) Int. Cl.[7] .............................................. H01L 23/48
(52) U.S. Cl. ........................ 257/758; 257/750; 257/773; 257/774; 257/763; 257/764; 257/765
(58) Field of Search ................................. 257/758, 750, 257/763–764, 773, 774, 765

(56) References Cited

U.S. PATENT DOCUMENTS 6,255,737 B1 * 7/2001 Hashimoto ................... 257/784
6,358,837 B1 * 3/2002 Miller et al. ................. 438/622
6,384,481 B1 * 5/2002 Hussein et al. .............. 257/750
6,433,435 B2 * 8/2002 Lin et al. ..................... 257/765

FOREIGN PATENT DOCUMENTS

| JP | 4-372175 | * 12/1992 | .................. 257/774 |
| JP | 05-095048 | 4/1993 | |
| JP | 11-274409 | 10/1999 | |
| JP | 11-317498 | 11/1999 | |
| JP | 2001-185687 | 7/2001 | |

* cited by examiner

Primary Examiner—Jasmine Clark
(74) Attorney, Agent, or Firm—Sonnenschein, Nath & Rosenthal LLP

(57) ABSTRACT

The present invention relates to a semiconductor device in which a capacitance element is mounted on a semiconductor substrate as well as a method of fabricating the device. According to the present invention, a substantial lower electrode is formed on a semiconductor substrate through a first insulation film; a peripheral electrode, i.e. the periphery of the lower electrode or a dummy electrode, which has the surface higher than the surface of the lower electrode being formed integrally with or separately from the lower electrode; an upper electrode being formed on the lower electrode through a dielectric film; a capacitance element being formed so that at least the surface of the dielectric film may lie on a level lower than the surface of the peripheral electrode; and a recess surrounded by the peripheral electrode being filled with a smoothing film.

As a result, when the smoothing film is formed, at least the dielectric film does not sustain damage and so a capacitance element having less fluctuation in its characteristics and high reliability can be obtained.

32 Claims, 24 Drawing Sheets

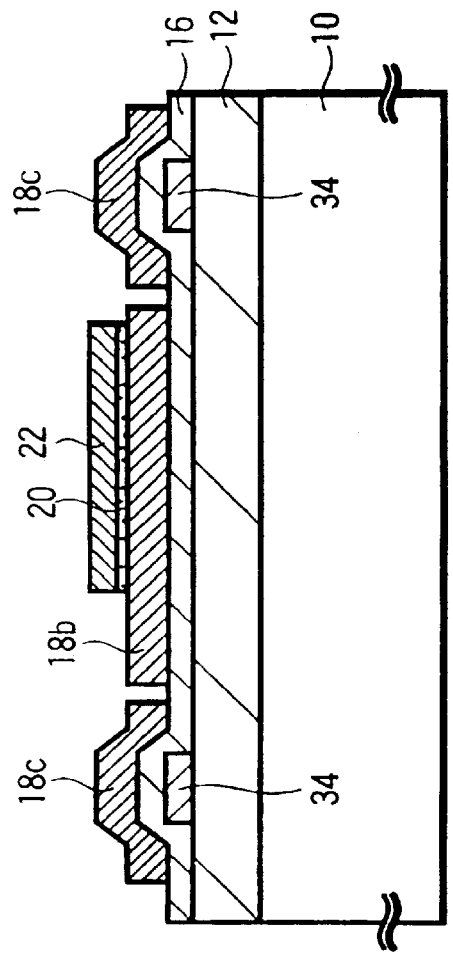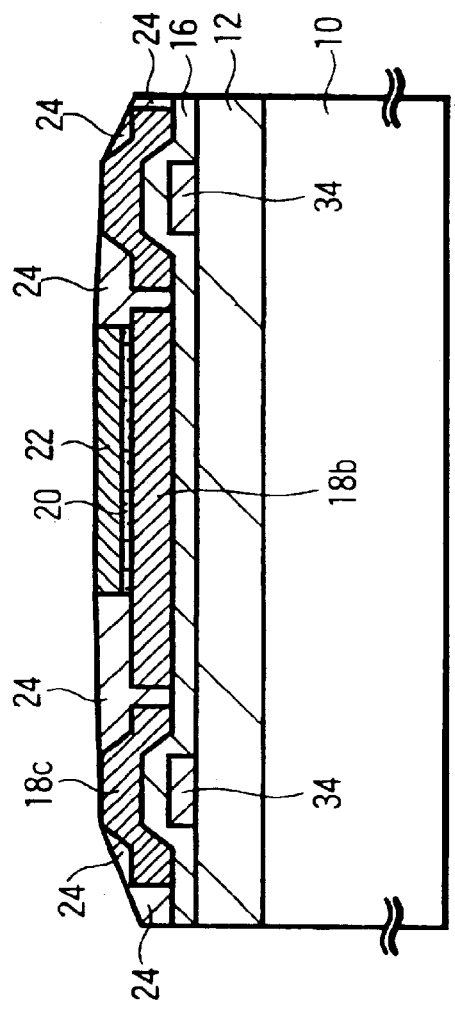
FIG. 35
FIG. 36

SEMICONDUCTOR DEVICE AND ITS MANUFACTURING METHOD

BACKGROUND OF THE INVENTION

The present invention relates to a semiconductor device and its fabricating method. Particularly, it relates to a semiconductor device in which a capacitance element is mounted on a semiconductor substrate and a method of fabricating the device.

BACKGROUND ART

A conventional process for fabricating LSI (Large-scale Integrated Circuit) where a capacitance element is formed on a semiconductor substrate will be described with reference to schematic sectional process diagrams of FIG. 39 to FIG. 41.

To start with, as shown in FIG. 39, a first insulation film 12 and a second insulation film 16 which are made of $SiO_2$ film or the like are piled in turn on a semiconductor substrate 10.

Subsequently, using the sputtering method for example, on the second insulation film 16 are piled a Ti layer, a TiON layer, a Ti layer, an Al—Si layer and a TiN layer in turn from below to form a TiN/Al—Si/Ti/TiON/Ti lamination film.

Subsequently, using CVD (Chemical Vapor Deposition) method for example, on the TiN/Al—Si/Ti/TiON/Ti lamination film is piled a dielectric film of $SiO_2$, SiN, $Ta_2O_5$ and the like. Further, using the sputtering method for example, on the dielectric film is piled a conductor layer of a Ti layer, a TiN layer or the like.

Then, through the photolithographing process and RIT (Reactive Ion Etching) process, these piled conductor layer and dielectric film are selectively removed by etching into a predetermined pattern to form an upper electrode 22 of Ti, TiN and the like on the TiN/Al—Si/Ti/TiON/Ti lamination film through a dielectric film 20 of $SiO_2$ SiN, $Ta_2O_5$ or the like.

Subsequently, through the photolithographing process and RIE process, the TiN/Al—Si/Ti/TiON/Ti lamination film 18 is selectively removed by etching into a predetermined pattern to form a lower electrode 18d of the TiN/Al—Si/Ti/TiON/Ti lamination film.

In this way, a capacitance element comprised of the upper electrode 22 and the lower electrode 18d which sandwich the dielectric film 20 between them is formed.

Subsequently, using the plasma CVD method for example, which uses TEOS (tetraethoxy silane; $Si(OC_2H_5)_4$) as raw materials, a $SiO_2$ film is piled on the whole surface of a base body including the upper electrode 22 and lower electrode 18d. After the $SiO_2$ film is further coated with SOG (Spin On Glass) film, a smoothing process that etches back these SOG film and $SiO_2$ film is performed. In other words, unevenness of the surface of the base body is smoothed by filling with a smoothing insulation film 24 formed of the $SiO_2$ film and SOG film.

Note that, on this occasion, because the surface of the upper electrode 22 formed on the lower electrode 18d lies on a higher level than the surface of the lower electrode 22, the surface of the upper electrode may have sometimes been in a exposed state.

Next, as shown in FIG. 40, using the plasma CVD method for example, an insulation film 26 made of, e.g. $SiO_2$ film is piled on the whole surface of the base body including the upper electrode 22 and the smoothing insulation film 24. An inter-layer insulation film 27 is thus formed by the smoothing insulation film 24 and insulation film 26.

Subsequently, using the photolithographing process and the dry etching method, the inter-layer insulation film 27 on the upper electrode 22 is selectively removed by etching and the inter-layer insulation film 27 on the lower electrode 18d is also selectively removed by etching to open a first via-hole 28d and a second via-hole 28e. At this time, in order to reduce a contact resistance, TiN in the surface of the lower electrode 18d may sometimes be removed.

Next, as shown in FIG. 41, after an Al-alloy layer is piled on the whole surface of the base body using the sputtering method for example, the Al-alloy layer is processed using the photolithographing process and the dry etching method to form a first Al-alloy upper layer wiring layer 30d and a second Al-alloy upper layer wiring layer 30e that are connected to the upper electrode 22 and the lower electrode 18d through the first and second via-holes 28d and 28e, respectively.

However, in the conventional process of forming a capacitance element, when the smoothing process to smooth unevenness of the surface of the base body by filling with the smoothing insulation film 24 formed of the $SiO_2$ film and SOG film is performed after a capacitance element comprised of the upper electrode 22 and lower electrode 18d that sandwich the dielectric film 20 between them is formed, because the surface of the upper electrode 22 formed on the lower electrode 18d lies on a higher level than the surface of lower electrode 18d, the upper electrode 22 and further, even the dielectric film 20 lying thereunder is subjected to etching by the etch-back in the smoothing process. That is to say, in the smoothing process, the upper electrode 22 and further the dielectric film 20 lying thereunder sustain damage.

Therefore, there is a problem in which characteristics of a capacitance element such as a capacitance value fluctuate or its reliability deteriorates, so that it is impossible to obtain such a capacitance element that has satisfactory characteristics and high reliability.

Moreover, when the first and second via-holes 28d and 28e are opened so as to form the first and second Al-alloy upper layer wiring layers 30d and 30e connected respectively to the upper electrode 22 and lower electrode 18d of a capacitance element, the film thickness of inter-layer insulation film 27 on the upper electrode 22 to be etched for opening the first via-hole 28d is thicker than the film thickness of inter-layer insulation film 27 on the lower electrode 18d to be etched for opening the second via-hole 28e. Thus, when the first and second via-holes 28d and 28e are both intended to be opened satisfactorily, excess over-etching on the surface of upper electrode 22 will inevitably take place. As a result, the upper electrode 22 or the dielectric film 20 lying thereunder will sustain damage due to the over-etching.

Consequently, this point also raises the problem in which the characteristics of capacitance element such as a capacitance value fluctuate or its reliability deteriorates, thus making it impossible to obtain such a capacitance element that has satisfactory characteristics and high reliability.

Furthermore, the following problem is also raised.

That is, in a conventional capacitance element, when comparison is made between distances from an area where the upper electrode 22 and lower electrode 18d are opposed to each other, which effectively functions as a capacitance element, to the first Al-alloy upper layer wiring layer 30d and to the second Al-alloy upper layer wiring layer 30e, the distance on the lower electrode side generally tends to be longer than that on the upper electrode side. As a result, the difference between their impedances occurs, thereby posing another problem of further adding to asymmetry in its characteristics.

When comparison is made between the first and second via-holes 28d and 28e in the conventional capacitance element, the depth of the second via-hole 28e on the lower electrode side is deeper than the depth of the first via-hole 28d on the upper side electrode side. This further increases the conventional asymmetry of its characteristics.

SUMMARY OF THE INVENTION

The present invention was made in view of the foregoing points at issue. An object of the present invention is to provide a semiconductor device and its fabricating method capable of preventing the fluctuation in characteristics such as capacitance value or deterioration of reliability by damage caused to the upper electrode or dielectric film during the process of fabricating a capacitance element, and further suppressing an increase of asymmetry in characteristics, thereby allowing a capacitance element with satisfactory characteristics and high reliability to be implemented.

A semiconductor device according to the present invention comprises: a lower electrode that is formed on a semiconductor substrate through a first insulation film and has a recess form section in which the surface of its periphery lies on a higher level than that of its center; an upper electrode that is formed on the center of the lower electrode through a dielectric film the surface of which lies on a lower level than that of the periphery of lower electrode; and a second insulation film which fills a recess of the lower electrode having a recess form section.

It should be noted that "the surface lies on a higher level" or "the surface lies on a lower level" used herein is wording to express a level of surface's height with respect to a flat plane of the top or bottom surface of a semiconductor substrate. This definition is hereinafter applied as well.

The present invention further comprises, in the above semiconductor device, an inter-layer insulation film that is formed as a third insulation film in the periphery of lower electrode, the upper electrode and the second insulation film, a first wiring layer that is connected to the upper electrode through a first via-hole opened in the inter-layer insulation film, and a second wiring layer that is connected to the periphery of the lower electrode through a second via-hole opened in the inter-layer insulation film.

A semiconductor device according to the present invention comprises: a lower electrode formed on a semiconductor substrate through a first insulation film; a dummy electrode formed around the lower electrode and having the surface higher than that of the lower electrode; an upper electrode that is formed on the lower electrode through a dielectric film the surface of which lies on a lower level than the top surface of the dummy electrode; and a second insulation layer that fills a recess surrounded by the dummy electrode.

It should be noted that "a dummy electrode having the surface higher than that of the dielectric film" as described above means that the top surface of the dummy electrode is higher than the surface of the lower electrode with a flat plane of the top or bottom surface of a semiconductor substrate as a reference. A description "the top surface of the dummy electrode" means the uppermost surface of surfaces of the dummy electrode. This definition is hereinafter applied as well.

The present invention further comprises, in the above semiconductor device, an inter-layer insulation film that is formed as a third insulation film on the dummy electrode, the upper electrode and the second insulation film, a first wiring layer that is connected to the upper electrode through a first via-hole opened in the inter-layer insulation film, and a second wiring layer that is connected to the periphery of the lower electrode through a second via-hole opened in the inter-layer insulation film.

A semiconductor device according to the present invention comprises: a lower electrode that is formed on a semiconductor substrate through a first insulation film and has a recess form section in which the surface of its periphery lies on a higher level than that of its center; an upper electrode that is formed on the center of the lower electrode through a dielectric film the surface of which lies on a lower level than that of the periphery of lower electrode; and a second insulation film which fills a recess of the lower electrode having a recess form section and at the same time, covers the surface of the upper electrode.

The present invention further comprises, in the above semiconductor device, an inter-layer insulation film that is formed as a third insulation film in the periphery of lower electrode, the upper electrode and the second insulation film, a first wiring layer that is connected to the upper electrode through a first via-hole opened in the inter-layer insulation film, and a second wiring layer that is connected to the periphery of the lower electrode through a second via-hole opened in the inter-layer insulation film.

A semiconductor device according to the present invention comprises: a lower electrode formed on a semiconductor substrate through a first insulation film; a dummy electrode formed around the lower electrode and having the surface higher than that of the lower electrode; an upper electrode formed on the lower electrode through the dielectric film and the surface of which lies on a lower level than the top surface of the dummy electrode; and a second insulation layer that fills a recess surrounded by the dummy electrode and at the same time, covers the surfaces of the lower and upper electrodes.

It should be noted that "a dummy electrode having the surface higher than that of the lower electrode" as described above means that the top surface of the dummy electrode is higher than the surface of the lower electrode with a flat plane of the top or bottom surface of a semiconductor substrate as a reference. A description "the top surface of the dummy electrode" means the uppermost surface of surfaces of the dummy electrode. This definition is hereinafter applied as well.

The present invention further comprises, in the above semiconductor device, an inter-layer insulation film that is formed as a third insulation film on the dummy electrode, the upper electrode and the second insulation film, a first wiring layer that is connected to the upper electrode through a first via-hole opened in the inter-layer insulation film, and a second wiring layer that is connected to the periphery of the lower electrode through a second via-hole opened in the inter-layer insulation film.

In the aforementioned semiconductor device, a dummy layer for making a level difference is provided below the periphery of the lower electrode, whereby the lower electrode is formed so as to have a recess form section.

Also, in the above semiconductor device, a dummy layer for making a level difference is provided below the dummy electrode, whereby the dummy electrode is formed so as to lie on a level higher than the lower electrode.

Such a dummy layer for making a level difference can be formed of the same material as that of an electrode or a resistance layer of other element in a semiconductor device. The dummy layer for making a level difference can also be formed of an insulation layer.

According to a semiconductor device of the present invention, because it comprises a lower electrode having a recess form section in which the surface of its periphery lies on a higher level than the surface of its center, and an upper electrode formed on the center of the lower electrode through a dielectric film the surface of which lies on a lower level than that of the periphery of lower electrode, namely, because the surface of dielectric film on the center of lower electrode with a recess form section is lower than that of the periphery of lower electrode, when the second insulation film serving as a smoothing insulation film on the whole surface of base body is formed, even if the smoothing process of etching back an insulation film or the like piled on the whole surface of base body is executed, the periphery of lower electrode forms an etching stopper which can prevent the dielectric film from sustaining damage. Therefore, it is possible to obtain a capacitance element having less fluctuation in its characteristics and high reliability.

Moreover, in a semiconductor device according to the present invention, the third insulation film is formed on the periphery of lower electrode, the upper electrode and the second insulation film to make an inter-layer insulation film; the first wiring layer connected to the upper electrode through the first via-hole opened in the inter-layer insulation film on the upper electrode being formed; and the second wiring layer connected to the periphery of lower electrode through the second via-hole opened in the inter-layer insulation film on the periphery of lower electrode being formed. Thus, the film thickness of inter-layer insulation film on the upper electrode to be etched for opening the first via-hole is approximately equal to that of inter-layer insulation film on the periphery of lower electrode to be etched for opening the second via-hole. Therefore, when the first and second via-holes are opened, it is possible to prevent the dielectric film under the upper electrode from suffering damage due to an excess overetching to the surface of upper electrode. Consequently, it is possible to obtain a capacitance element which, in addition to the above advantage, has still less fluctuation in its characteristics and higher reliability. Furthermore, in comparing the first via-hole with second via-hole, the depth of the second via-hole opened on the periphery of lower electrode is approximately equal to the depth of the first via-hole opened on the upper electrode. Thus, of the distances from an area where the upper and lower electrodes are opposed to each other and which effectively functions as a capacitance element to the first and second wiring layers, the distance on the lower electrode side which generally tends to be longer than that on the upper electrode side can be shortened. Therefore, it is possible to reduce the difference of their impedances to suppress an increase of asymmetrical characteristics of a capacitance element and thus improve symmetry of characteristics thereof.

A semiconductor device according to the present invention comprises a lower electrode, a dummy electrode formed around the lower electrode and having the surface higher than that of the lower electrode, and an upper electrode formed on the lower electrode through a dielectric film, wherein the surface of the dielectric film on the lower electrode is lower than the top surface of the dummy electrode around the lower electrode. Thus, when the second insulation film serving as a smoothing insulation film is formed on the whole surface of base body, even if a smoothing process to etch back the insulation film piled on the whole surface of base body is performed the dummy electrode becomes an etching stopper and the dielectric film can be prevented from sustaining damage. Therefore, it is possible to obtain a capacitance element having less fluctuation in its characteristics and high reliability.

A semiconductor device according to the present invention comprises a lower electrode having a recess form section in which the surface of its periphery is on a higher level than that of its center, and an upper electrode formed on the center of the lower electrode through a dielectric film and having the surface lower than that of the periphery of lower electrode. In other words, the surface of upper electrode on the center of lower electrode having a recess form section is lower than that of the periphery of lower electrode. Thus, when the second insulation film serving as a smoothing insulation film is formed on the whole surface of base body, the surface of the upper electrode is always in a state covered by the second insulation film. As a result, even if a smoothing process to etch back the insulation film piled on the whole surface of base body is executed, together with the fact that the periphery of lower electrode acts as a etching stopper, it is possible to prevent the upper electrode and further the dielectric film thereunder from suffering damage. Therefore, it is possible to obtain a capacitance element having less fluctuation in its characteristics and high reliability.

Moreover, a semiconductor device according to the present invention further comprises an inter-layer insulation film formed as a third insulation film on a second insulation film covering the periphery of lower electrode and the surface of upper electrode, a first wiring layer connected to the upper electrode through a first via-hole opened in the inter-layer insulation film on the upper electrode, and a second wiring layer connected to the periphery of lower electrode through a second via-hole opened in the inter-layer insulation film on the periphery of lower electrode. Thus, the film thickness of inter-layer insulation film on the upper electrode to be etched for opening a first via-hole is thicker than that of inter-layer insulation film on the periphery of lower electrode to be etched for opening a second via-hole. Consequently, when the first and second via-holes are opened, it is possible to prevent the upper electrode and further a dielectric film thereunder from sustaining damage due to excess overetching to the surface of upper electrode. Therefore, it is possible to obtain a capacitance element which, in addition to the above advantage, has still less fluctuation in its characteristics and high reliability.

Furthermore, in comparing the first via-hole with second via-hole, the depth of the second via-hole opened on the periphery of lower electrode is shallower than that of the first via-hole opened on the upper electrode. Thus, of distances from an area where the upper electrode and lower electrode are opposed to each other and which functions effectively as a capacitance element to the first and second wiring layers, the distance on the lower electrode side which generally tends to be longer than that on the upper electrode side is shortened. This makes the difference in their impedances small to suppress an increase of asymmetry in characteristics of a capacitance element, thereby allowing symmetry in characteristics of the capacitance element to be improved.

A semiconductor device according to the present invention comprises a lower electrode, a dummy electrode formed around the lower electrode and having the surface higher than that of the lower electrode, and an upper electrode formed on the lower electrode through a dielectric film, wherein the surface of upper electrode on the lower electrode is lower than the top surface of the dummy electrode around the lower electrode. Thus, when the second insulation film serving as a smoothing insulation film is formed on the whole surface of a base body, the second insulation film makes it possible to cover the surface upper electrode easily. Therefore, even if a smoothing process to etch back the insulation film piled on the whole surface of the base body is executed, it is possible to prevent the upper electrode and further the dielectric film thereunder from sustaining damage as a result of the surface of upper electrode being etched, together with the fact that the dummy electrode acts as a etching stopper. Consequently, it is possible to obtain a capacitance element having less fluctuation in its characteristics and high reliability.

In a case where, in the above semiconductor device according to the present invention, the dummy layer for making a level difference provided below the periphery of lower electrode is formed of the same material as those of electrodes or resistance layers of other elements in the semiconductor device, simplification of its fabrication can be realized. Also, in the case where the dummy layer for making a level difference provided below the dummy electrodes is formed of the same conductor layer as are wiring layers of other elements in the semiconductor device, its fabrication can be simplified.

A method of fabricating a semiconductor device according to the present invention comprises the steps of: forming a dummy layer with a predetermined thickness for making a level difference in the periphery of a predefined area of forming a capacitance element on a semiconductor substrate through a first insulation film; piling a conductor film on these first insulation film and dummy layer and then patterning the conductor film so as to form a lower electrode with a recess form section in which the surface of its periphery lies on a higher level than the surface of its center, in the predefined area of forming a capacitance element; forming an upper electrode through a dielectric film the surface of which lies on a lower level than that of the periphery of lower electrode; and forming a second insulation film on the whole surface of a base body to fill a recess of the lower electrode having a recess form section.

A method of fabricating a semiconductor device according to the present invention further comprises the steps of: forming a third insulation film on the whole surface of a base body including the periphery of the lower electrode, the upper electrode and the second insulation film to form an inter-layer insulation film; opening a first via-hole in the inter-layer insulation film on the upper electrode and also forming a second via-hole in the inter-layer insulation film on the periphery of the lower electrode; and forming a first wiring layer connected to the upper electrode through the first via-hole and also forming a second wiring layer connected to the periphery of the lower electrode through the second via-hole.

A method of fabricating a semiconductor device according to the present invention comprises the steps of: forming a dummy layer with a predetermined thickness for making a level difference in the periphery of a predefined area of forming a capacitance element on a semiconductor substrate through a first insulation film; piling a conductor film on these first insulation film and dummy layer and then patterning the conductor film so as to form a lower electrode in the predefined area of forming a capacitance element and forming a dummy electrode in the periphery of the predefined area of forming the capacitance element as covers the dummy layer and has a surface higher than the surface of the lower electrode; and forming an upper electrode on the lower electrode through the dielectric film the surface of which lies on a lower level than the top surface of the dummy electrode; and forming a second insulation film on the whole surface of a base body to a recess the periphery of which is surrounded by the dummy electrode.

A method of fabricating a semiconductor device according to the present invention further comprises the steps of: forming a third insulation film on the whole surface of the base body including the dummy electrode, the upper electrode and the second insulation film to form an inter-layer insulation film; opening a first via-hole in the inter-layer insulation film on the upper electrode and also forming a second via-hole in the inter-layer insulation film in the lower electrode; and forming a first wiring layer connected to the upper electrode through the first via-hole and also forming a second wiring layer connected to the lower electrode through the second via-hole.

A method of fabricating a semiconductor device according to the present invention comprises the steps of: forming a dummy layer with a predetermined thickness for making a level difference around a predefined area of forming a capacitance element on a semiconductor substrate through a first insulation film; piling a conductor film on these first insulation film and dummy layer and then patterning the conductor film so as to form a lower electrode with a recess section form the surface of which lies on a higher level than the surface thereof in the predefined area of forming the capacitance element; forming an upper electrode, whose surface lies on a lower level than the surface of the periphery of the lower electrode, on the central part of the lower electrode through a dielectric film; and forming a second insulation film on the whole surface of a base body to fill a recess section form of the lower electrode to cover the surface of the upper electrode.

A method of fabricating a semiconductor device according to the present invention further comprises the steps of: forming a third insulation film on the whole surface of the base body including the dummy electrode and the second insulation film to form an inter-layer insulation film; opening a first via-hole in the inter-layer insulation film on the upper electrode and also opening a second via-hole in the inter-layer insulation film on the lower electrode; and forming a first wiring layer connected to the upper electrode through the first via-hole and also forming a second wiring layer connected to the lower electrode through the second via-hole.

A method of fabricating a semiconductor device according to the present invention comprises the steps of: forming a dummy layer with a predetermined thickness for making a level difference in the periphery of a predefined area of forming a capacitance element on a semiconductor substrate through a first insulation film; piling a conductor film on these first insulation film and dummy layer and then patterning the conductor film so as to form a lower electrode in the predefined area of forming a capacitance element and forming a dummy electrode in the periphery of the predefined area of forming the capacitance element as covers the dummy layer and has a surface higher than the surface of the lower electrode; and forming an upper electrode the surface of which lies on a lower level than the top surface of the dummy electrode, on the lower electrode through the dielectric film; and forming a second insulation film on the whole surface of a base body to fill a recess the periphery of which is surrounded by the dummy electrode and also cover the surfaces of the lower and upper electrodes.

A method of fabricating a semiconductor device according to the present invention further comprises the steps of:

forming a third insulation film on the whole surface of the base body including the dummy electrode, the upper electrode and the second insulation film to form an inter-layer insulation film; opening a first via-hole in the inter-layer insulation film on the upper electrode and also forming a second via-hole in the inter-layer insulation film in the lower electrode; and forming a first wiring layer connected to the upper electrode through the first via-hole and also forming a second wiring layer connected to the lower electrode through the second via-hole.

In the above described method of fabricating a semiconductor device, the process of forming the dummy layer for making a level difference can be combined with the process of forming electrodes or resistance layers of other elements in the semiconductor device. The dummy layer for making a level difference can be formed of an insulation layer.

A method of fabricating a semiconductor device according to the present invention comprises the steps of: forming a dummy layer with a predetermined thickness for making a level difference in the periphery of a predefined area of forming a capacitance element on a semiconductor substrate through a first insulation film; patterning a conductor film piled on the dummy layer to form a lower electrode with a recess form section in which the surface of its periphery lies on a higher level than the surface of its center in a predefined area of forming a capacitance element; and forming an upper electrode on the center of lower electrode through a dielectric film the surface of which lies on a lower level than the surface of periphery of lower electrode. Thus, when the second insulation film serving as a smoothing insulation film is formed, even if a smoothing process to etch back the insulation film piled on the whole surface of a base body is executed, the periphery of lower electrode acts as an etching stopper, thereby allowing the dielectric film to be prevented from suffering damage. Therefore, it is possible to obtain a capacitance element having less fluctuation in its characteristics and high reliability.

Moreover, a method of fabricating a semiconductor device according to the present invention further comprises the steps of: forming a third insulation film on the whole surface of the base body including the periphery of the lower electrode, the upper electrode and the second insulation film to form an inter-layer insulation film; and then forming a first wiring layer connected to the upper electrode through the first via-hole opened in the inter-layer insulation film on the upper electrode and also forming a second wiring layer connected to the periphery of lower electrode through the second via-hole opened in the inter-layer insulation film on the periphery of lower electrode. Thus, the film thickness of the inter-layer insulation film on the upper electrode to be etched for opening the first via-hole becomes approximately equal to the film thickness of the inter-layer insulation film on the periphery of lower electrode to be etched for opening the second via-hole. Therefore, when the first and second via-holes are opened, it is possible to prevent the dielectric film under the upper electrode from sustaining damage due to an excess overetching to the surface of the upper electrode. Consequently, it is possible to obtain a capacitance element having in addition to the above advantage, still less fluctuation in its characteristics and higher reliability.

In comparing the first via-hole with the second via-hole, the depth of the second via-hole opened on the lower electrode becomes approximately equal to the depth of the first via-hole opened on the upper electrode. Thus, of distances from an area where the upper and lower electrodes are opposed to each other and which effectively functions as a capacitance element to the first and second wiring layers, the distance on the lower electrode side which generally tends to be longer than that on the upper electrode side is shortened. This makes the difference in their impedances decrease to thereby suppress an increase of asymmetry in characteristics of a capacitance element and improve symmetry in characteristics of the capacitance element.

A method of fabricating a semiconductor device according to the present invention comprises the steps of: forming a dummy layer with a predetermined thickness for making a level difference in the periphery of a predefined area of forming a capacitance element on a semiconductor substrate through a first insulation film; patterning thereafter a conductor film piled on these first insulation film and dummy layer to form a lower electrode in a predefined area of forming a capacitance element and also form a dummy electrode that covers the dummy layer and has the surface higher than that of the lower electrode around the predefined area of forming a capacitance element; and forming an upper electrode on the lower electrode through a dielectric film the surface of which lies on a lower level than the top surface of the dummy electrode. Thus, when a second insulation film serving as a smoothing insulation film is formed, even if a smoothing process to etch back an insulation film piled up all over the base body is executed, the dummy electrode acts as an etching stopper, whereby it is possible to prevent the dielectric film from sustaining damage. Therefore, it is possible to obtain a capacitance element having less fluctuation in its characteristics and high reliability.

A method of fabricating a semiconductor device according to the present invention comprises the steps of: forming a dummy layer with a predetermined thickness for making a level difference in the periphery of a predefined area of forming a capacitance element on a semiconductor substrate through a first insulation film; patterning a conductor film piled on these first insulation film and dummy layer to form a lower electrode with a recess form section in which the surface of its periphery lies on a higher level than the surface of its center; and forming an upper electrode the surface of which lies on a lower level than the surface of the periphery of lower electrode on the center of lower electrode through a dielectric film, whereby it is possible to easily materialize covering the surface of upper electrode by a second insulation film formed on the whole surface of a base body. Thus, when the second insulation film serving as a smoothing insulation film is formed, even if a smoothing process to etch back the insulation film piled on the whole surface of the base body, the periphery of lower electrode becomes an etching stopper, thereby making it possible to avoid that the surface of upper electrode is etched to cause damage to the upper electrode and further the dielectric film thereunder. Therefore, it is possible to obtain a capacitance element having less fluctuation in its characteristics and high reliability.

Moreover, a method of fabricating a semiconductor device according to the present invention further comprises the steps of: forming a third insulation film on the whole surface of a base body including the periphery of the lower electrode and the second insulation film covering the surface of the upper electrode to form an inter-layer insulation film; and thereafter forming a first wiring layer connected to the upper electrode through a first via-hole opened in the inter-layer insulation film on the upper electrode and also forming a second wiring layer connected to the periphery of lower electrode through a second via-hole opened in the inter-layer insulation film on the periphery of lower electrode. As a result, the film thickness of the inter-layer insulation film on the upper electrode to be etched for opening the first via-hole becomes thicker than that of the inter-layer insulation film on the periphery of lower electrode to be etched for opening the second via-hole. Thus, when the first and second via-holes are opened, it is possible to prevent the upper electrode and further the dielectric film thereunder from suffering damage due to an excess overetching to the surface of upper electrode. Therefore, it is possible to obtain a capacitance element having, in addition to the above advantage, still less fluctuation in its characteristics and higher reliability.

Also, in comparing the first via-hole with the second via-hole, the depth of the second via-hole opened on the lower electrode becomes shallower than that of the first via-hole opened on the upper electrode. Thus, of distances from an area where the upper and lower electrodes are opposed to each other and which functions effectively as a capacitance element to the first and second wiring layers, the distance on the lower electrode side which generally tends to be longer is made shorter. Therefore, it is possible to reduce the difference in their impedances and suppress an increase of asymmetry in characteristics of a capacitance element, thereby allowing symmetry in characteristics of the capacitance element to be improved.

A method of fabricating a semiconductor device according to the present invention comprises the steps of: forming a dummy layer with a predetermined thickness for making a level difference around a predetermined area of forming a capacitance element on a semiconductor substrate through a first insulation film; patterning thereafter a conductor film piled on these first insulation film and dummy layer to form a lower electrode in the predefined area of forming a capacitance element and also form a dummy electrode that covers the dummy layer and has the surface higher than the surface of lower electrode around the predefined area of forming a capacitance element; and forming an upper electrode the surface of which lies on a lower level than the top surface of the dummy electrode, on the lower electrode through a dielectric film. As a result, it is possible to easily materialize covering the surface of upper electrode by a second insulation film formed on the whole surface of a base body. Thus, when the second insulation film serving as a smoothing insulation film is formed, even if a smoothing process to etch back the insulation film piled on the whole surface of the base body is executed, the dummy electrode becomes an etching stopper and so it is possible to prevent the upper electrode and further the dielectric film thereunder from sustaining damage. Therefore, it is possible to obtain a capacitance element having less fluctuation in its characteristics and high reliability.

In the above method of fabricating a semiconductor device according to the present invention, by combining the process of forming the dummy layer for making a level difference with a process of forming an electrode or a resistance layer of another element in a semiconductor device, it is possible to aim at simplifying its fabrication process.

BRIEF DESCRIPTION OF DRAWINGS

FIG. 35 is a schematic sectional process diagram (No.3) for explaining the method of fabricating the capacitance element shown in FIG. 32.

FIG. 36 is a schematic sectional process diagram (No.4) for explaining the method of fabricating the capacitance element shown in FIG. 32.

DETAILED DESCRIPTION OF THE INVENTION

Modes for carrying out the invention, or embodiments of the present invention will be described below with reference to the accompanying drawings.

A First Embodiment

Figure 1:
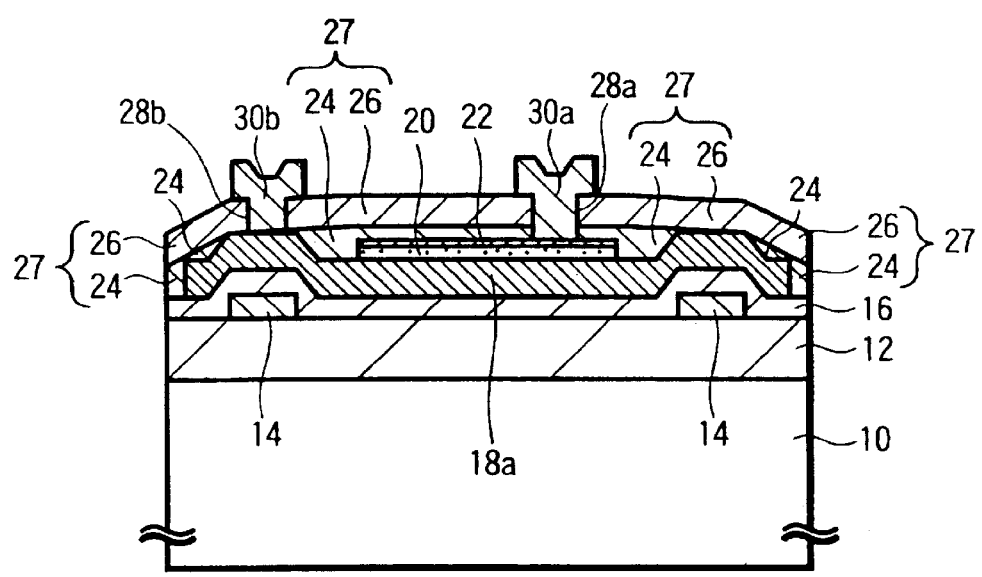
FIG. 1 is a schematic sectional diagram showing a capacitance element according to a first embodiment of the present invention.

FIG. 1 is a schematic sectional diagram showing a capacitance element according to a first embodiment of the present invention. FIG. 2 to FIG. 9 are schematic sectional process diagrams for explaining the method of fabricating the capacitance element shown in FIG. 1, respectively.

As shown in FIG. 1, in the capacitance element according to this embodiment, there is formed a polysilicon dummy layer 14 for making a level difference in the periphery of a predefined area of forming the capacitance element on a semiconductor substrate 10 through a first insulation film 12 made of, e.g. a $SiO_2$ film. The dummy layer 14 is made of a polysilicon layer having a predetermined thickness of, e.g. 100 nm to 500 nm or so. On the first insulation film 12 and the polysilicon dummy layer 14 is formed a second insulation film 16. Note that the second insulation film 16 can be dispensed with.

Moreover, on the second insulation film 16 is formed a lower electrode 18a made of a TiN/Al—Si/Ti/TiON/Ti lamination film or Cu, Al—Cu and the like. In the lamination film, for example a Ti layer with about 5 to 70 nm thickness, a TiON layer with about 10 to 200 nm thickness, a Ti layer with about 5 to 70 nm thickness, an Al—Si layer with about 300 to 1500 nm thickness, and an TiN layer with about 5 to 70 nm thickness are piled in turn from below.

Specifically, the lower electrode 18a has a recess form section in which the surface of its periphery on the polysilicon dummy layer 14 with about 100 to 500 nm thickness for making a level difference lies on a higher level than the surface of its center by 100 to 500 nm or so.

Additionally, in the lower electrode 18a of such a TiN/Al—Si/Ti/TiON/Ti multilayer, the uppermost TiN layer functions as an antireflection coating in the photolithographing step during its fabrication process and as an antioxidation film of the Al—Si layer thereunder. The Al—Si layer functions as the principal part of electrodes that require a conductive characteristic. The lower Ti/TiON/Ti layered film functions as a barrier metal.

Furthermore, on the center of the lower electrode 18a is formed an upper electrode 22 made of Ti, TiN or a Ti/TiN layered film having 5 to 100 nm or so thickness, through a dielectric film 20 made of $Ta_2O_5$, $SiO_2$ or SiN and the like, having a predetermined thickness of, e.g. 10 to 300 nm or so, in this embodiment $Ta_2O_5$ dielectric film. When the dielectric film 20 is formed of $ta_2O_5$, it is preferable to form the upper electrode 22 out of TiN or a layered film in which TiN and Ti are piled in this order, TiN and the layered film being hard to react with oxygen. When the dielectric film 20 is formed of $SiO_2$, SiN and the like, the upper electrode 22 can be formed of Ti, TiN or a TiN/Ti layered film.

In this manner, a capacitance element is formed from the upper electrode 22 and the lower electrode 18a which sandwich the dielectric film 20 between them.

Then, the surface of the upper electrode 22 formed on the center of the lower electrode 18a with a recess form section of this capacitance element becomes lower than the surface of the periphery of lower electrode 18a with a recess form section over the polysilicon dummy layer 14.

Moreover, a smoothing process to unevenness of a base body including the upper electrode 22 and lower electrode 18a is performed. Specifically, a smoothing insulation film 24 comprised of $SiO_2$ film piled on the whole surface of the base body, for example, using the plasma CVD method with the TEOS as a raw material as well as SOG film coated thereon is formed. This smoothing insulation film 24 fills a recess of the lower electrode 18a with a recess form section and also covers the surface of upper electrode 22.

Furthermore, on the smoothed whole surface of the base body, namely, on the periphery of lower electrode 18a and the smoothing insulation film 24 is piled an insulation film 26 made of, e.g. $SiO_2$ film. The smoothing insulation film 24 and insulation film 26 form an inter-layer insulation film 27.

Then, a first upper-layer wiring layer 30a which is made of, e.g. an Al-alloy layer and connected to the upper electrode 22 is formed through a first via-hole 28a opened in the inter-layer insulation film 27 on the upper electrode 22.

Also, a second upper-layer wiring layer 30b which is made of, e.g. an Al-alloy layer and connected to the periphery of lower electrode 18a is formed through a second via-hole 28b opened in the inter-layer insulation film 27 on the periphery of lower electrode 18a.

Next, a method of fabrication the capacitance element shown in FIG. 1 will be described with reference to schematic sectional process diagrams of FIG. 2 to FIG. 9.

Figure 2:
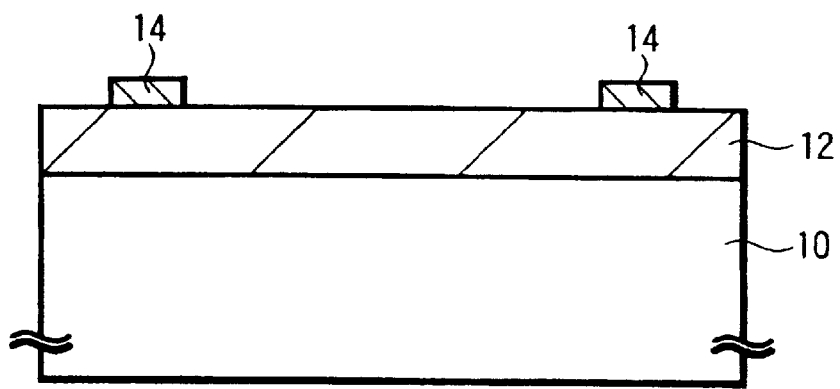
FIG. 2 is a schematic sectional process diagram (No.1) for explaining the method of fabricating the capacitance element shown in FIG. 1.

To begin with, as shown in FIG. 2, after the first insulation film 12 which is made of, e.g. $SiO_2$ film is formed on the semiconductor substrate 10, for example, a polysilicon layer with a predetermined thickness, e.g. about 100 to 500 nm thickness is further formed on the first insulation film 12. Subsequently, through the photolithographing process and RIE process, the polysilicon layer is selectively removed by etching to pattern it into a predetermined shape.

In this way, a polysilicon dummy layer 14 made of a polysilicon layer of about 100 to 500 nm thickness for making a level difference is formed on the periphery of a predefined area of forming a capacitance element on the semiconductor substrate 10 through the first insulation film 12.

It is noted that the process of forming the polysilicon dummy layer 14 can be combined with the process of forming a polysilicon layer used as a gate electrode of other elements, e.g. MOSTr (Metal Oxide Semiconductor Transistor), a resistance layer of a resistance element, and an electrode of BipTr (bipolar transistor) in LSI.

Figure 3:
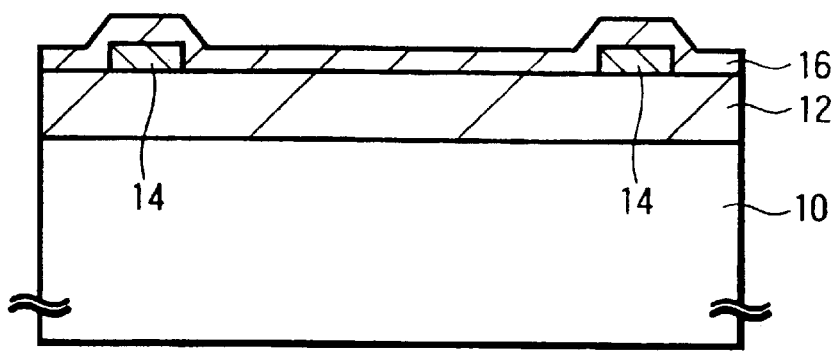
FIG. 3 is a schematic sectional process diagram (No.2) for explaining the method of fabricating the capacitance element shown in FIG. 1.

Next, as shown in FIG. 3, the second insulation film 16 is formed on the whole surface of a base body including the polysilicon dummy layer 14 for making a level difference. Note that the second insulation film 16 may be omitted to form.

Figure 4:
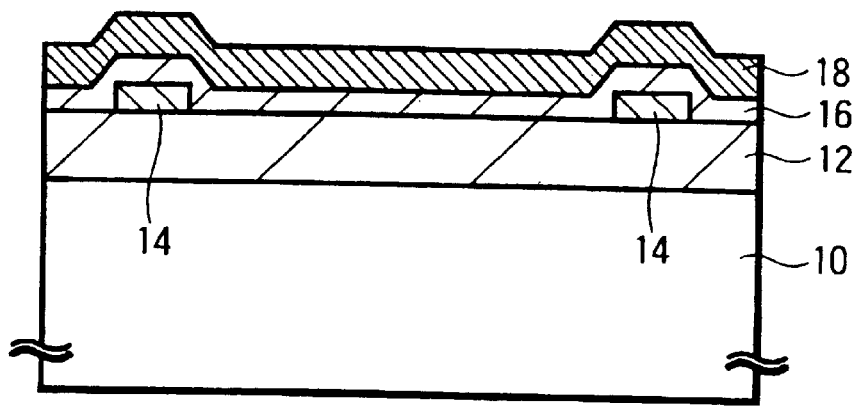
FIG. 4 is a schematic sectional process diagram (No.3) for explaining the method of fabricating the capacitance element shown in FIG. 1.

Next, as shown in FIG. 4, using the sputtering method for example, a conductor film with a predetermined thickness is formed. For example, the conductor film is a TiN/Al—Si/Ti/TiON/Ti lamination film 18 comprised of a Ti layer with about 5 to 70 nm thickness, a TiON layer with about 10 to 200 nm thickness, a Ti layer with about 5 to 70 nm thickness, an Al—Si layer with about 300 to 1500 nm thickness, and a TiN layer with about 5 to 70 nm thickness which are piled in turn from below.

Additionally, in such a multilayered structure, the uppermost TiN layer functions as an antireflection coating in the photolithographing step during the fabrication process and as an antioxidation film of the Al—Si layer lying thereunder. The lower Ti/TiON/Ti lamination film functions as a barrier metal.

Also, in the TiN/Al—Si/Ti/TiON/Ti lamination film 18, the surface of polysilicon dummy layer 14 with about 100 to 500 nm thickness for making a level difference is higher than the surface of an area surrounded by the polysilicon dummy layer 14 by 100 to 500 nm or so.

Figure 5:
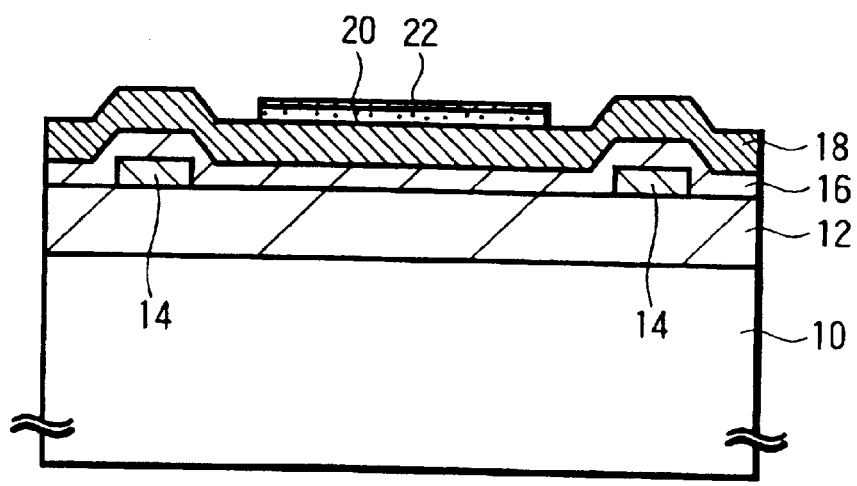
FIG. 5 is a schematic sectional process diagram (No.4) for explaining the method of fabricating the capacitance element shown in FIG. 1.

Next, as shown in FIG. 5, a dielectric film made of $Ta_2O_5$, $SiO_2$, SiN and the like, in this embodiment $Ta_2O_5$ dielectric film is piled on the TiN/Al—Si/Ti/TiON/Ti lamination film 18, using the CVD method for example, up to a predetermined thickness of, e.g. 10 to 300 nm or so. Further using the sputtering method for example, a conductor layer made of, e.g. a Ti layer, a TiN layer or a Ti/TiN layered film is piled on the dielectric film up to a predetermined thickness of, e.g. 5 to 100 nm or so.

Subsequently, through the photographing process and RIE process, these layered conductor layer and dielectric film are selectively removed by etching into a predetermined pattern.

In this manner, an upper electrode 22 made of a Ti layer, or a Ti/TiN layered film having a thickness of about 5 to 100 nm is formed on the TiN/Al—Si/Ti/TiON/Ti lamination film 18 in the area surrounded by the polysilicon dummy layer 14 through the dielectric film 20 having a thickness of about 10 to 300 nm.

Note that the surface of the upper electrode 22 at this time is lower in height than the surface of a portion of the lamination film 18 situated over the polysilicon dummy layer 14.

Figure 6:
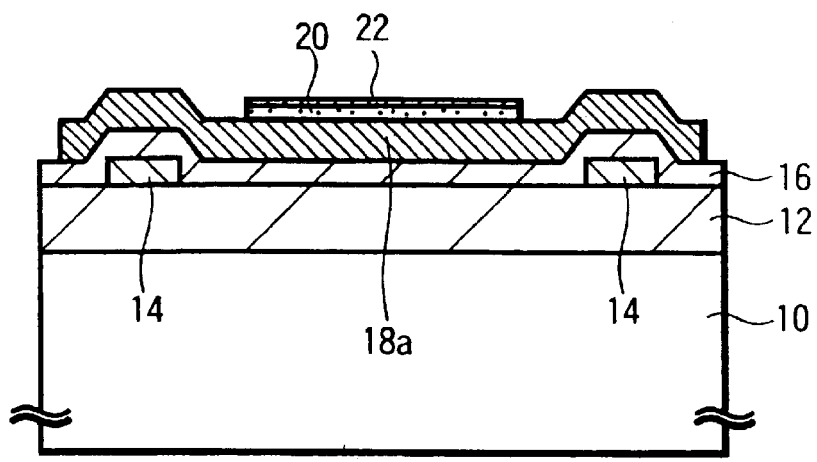
FIG. 6 is a schematic sectional process diagram (No.5) for explaining the method of fabricating the capacitance element shown in FIG. 1.

Next as shown in FIG. 6, through the photolithographing process and RIE process, the TiN/Al—Si/Ti/TiON/Ti lamination film 18 is selectively removed by etching into a predetermined pattern.

A lower electrode 18a made of the TiN/Al—Si/Ti/TiON/Ti lamination film is thus formed. It has a recess form section in which the surface of its periphery over the polysilicon dummy layer 14 for making a level difference lies on a higher level than the surface of its center where the upper electrode 22 is formed. In addition, at the same time with forming the lower electrode 18a, a lower wiring layer (not shown) made of a TiN/Al—Si/Ti/TiON/Ti lamination film of other elements in LSI is formed.

In this manner, a capacitance element is formed. It is comprised of the upper electrode 22 and lower electrode 18a that sandwich the dielectric film 20 between them.

Additionally, the surface of upper electrode 22 of the capacitance element at this time is lower in height than the surface of the periphery of lower electrode 18a situated over the polysilicon dummy layer 14.

Figure 7:
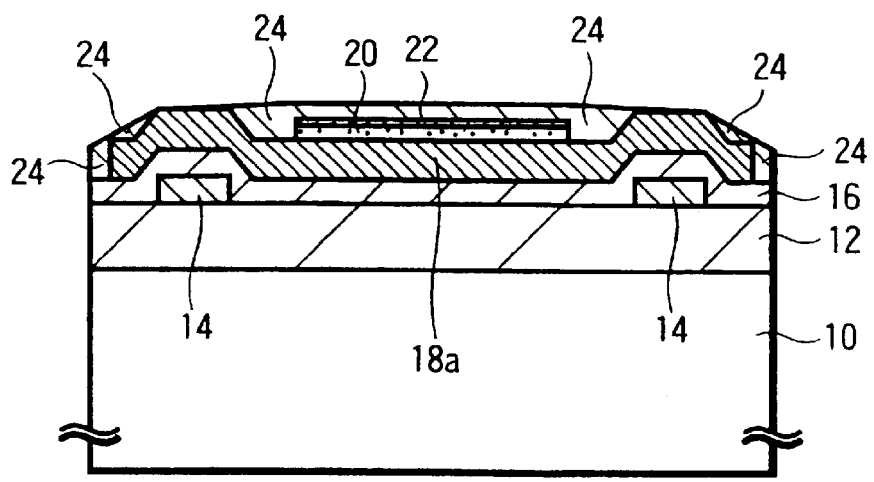
FIG. 7 is a schematic sectional process diagram (No.6) for explaining the method of fabricating the capacitance element shown in FIG. 1.

Next, as shown in FIG. 7, a smoothing process to smooth unevenness of the whole surface of the base body is executed. Specifically, using the plasma CVD method for example, taking the TEOS as a raw material, on the whole surface of the base body including the upper electrode 22 and lower electrode 18a is piled, for example, a $SiO_2$ film up to a thickness of 300 to 1500 nm or so. In addition, the $SiO_2$ film is coated with a SOG film. Thereafter, these SOG film and $SiO_2$ film are etched back.

A smoothing insulation film 24 is thus formed. It fills a recess of the lower electrode 18a having a recess form section and also covers the surface of upper electrode 22 to smooth the whole surface of base body.

It is noted that, in the process of smoothing the whole surface of base body, namely, the process of forming the smoothing insulation film 24, the surface of upper electrode 22 formed on the center of lower electrode 18a with a recess form section is lower in level than the surface of the periphery of lower electrode 18a with a recess form section situated over the polysilicon dummy layer 14. Also, in a general smoothing etch-back, the etching rate of $SiO_2$ is not so different from those of Ti and TiN, so that in the etch-back after the SOG film and SiO film are formed, although the surface of the periphery of lower electrode 18a is exposed, the surface of upper electrode 22 is always covered with the smoothing insulation film 24 and thus never be exposed by the etching. In other words, the upper electrode 22 and the dielectric film 20 thereunder will never sustain damage.

Figure 8:
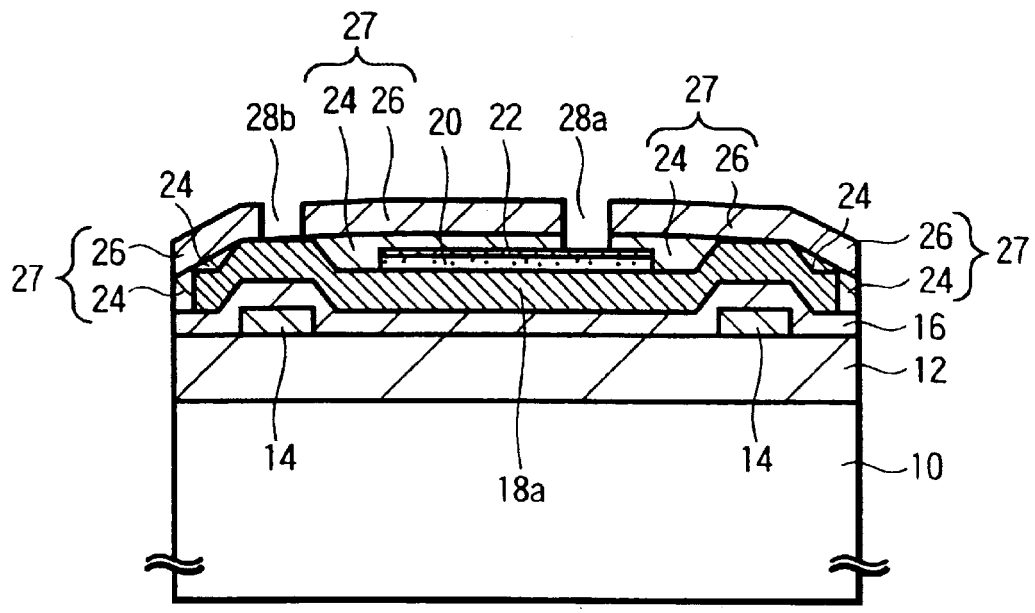
FIG. 8 is a schematic sectional process diagram (No.7) for explaining the method of fabricating the capacitance element shown in FIG. 1.

Next, as shown in FIG. 8, using the plasma CVD method for example, on the whole surface of base body including the periphery of lower electrode 18a and the smoothing insulation film 24 is piled an insulation film 26 made of, e.g. $SiO_2$ film. The smoothing insulation film 24 and insulation film 27 form an inter-layer insulation film 27.

Subsequently, using the photolithographing process and dry etching method, the inter-layer insulation film 27 on the upper electrode 22 is selectively removed by etching and also the inter-layer insulation film 27 on the periphery of lower electrode 18a is selectively removed by etching to open a first via-hole 28a and a second via-hole 28b, respectively. On this occasion, in order to decrease the contact resistance, only TiN layer on the surface of lower electrode 18a may sometimes be removed.

It is noted at this time that a total film thickness of the inter-layer insulation film 27 on upper electrode 22 to be etched for opening the first via-hole 28a is thicker than a film thickness of the inter-layer insulation film 26 on the periphery of lower electrode 18a to be etched for opening the second via-hole 28b. For this reason, when these first and second via-holes 28a and 28b are opened, an excess overetching to the surface of upper electrode 22 will never happen.

Figure 9:
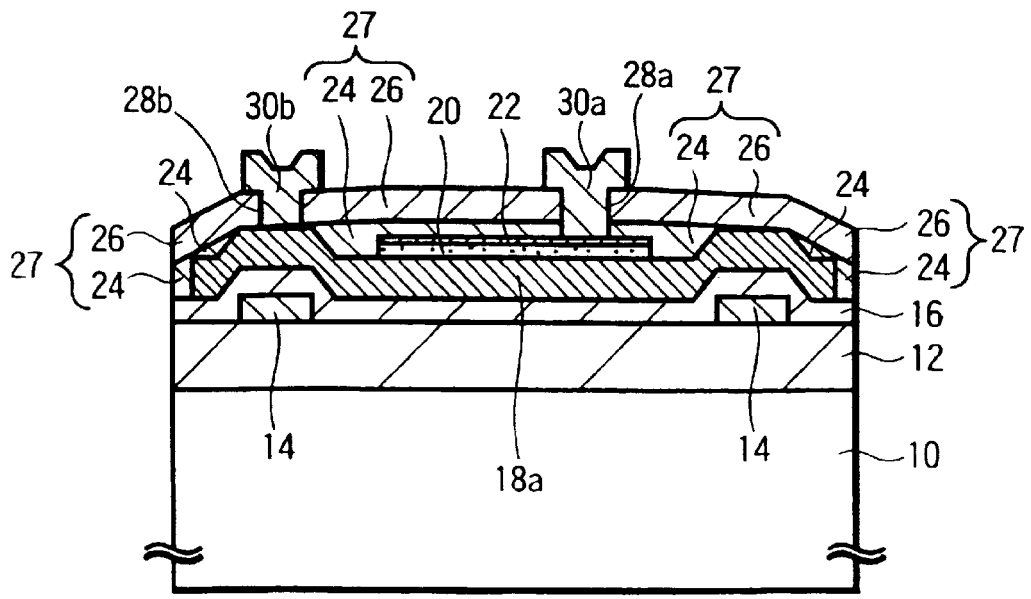
FIG. 9 is a schematic sectional process diagram (No.8) for explaining the method of fabricating the capacitance element shown in FIG. 1.

Next, as shown in FIG. 9, after an Al-alloy layer is piled using the sputtering method for example, the Al-alloy layer is processed using the photolithographing process and dry etching method to form a first upper-layer wiring layer 30a and a second upper-layer wiring layer 30b which are made of the Al-alloy layer and connect respectively to the upper electrode 22 and the periphery of lower electrode 18a through the first and second via-holes 28a and 28b.

Simultaneously with the formation of the first and second upper-layer wiring layers 30a and 30b, upper-layer wiring layers (not shown) of other elements in LSI are formed.

As described above, in this embodiment, the polysilicon dummy layer 14 for making a level difference, which is made of a polysilicon layer having a thickness of about 100 to 500 nm is formed on the periphery of a predefined area of forming the capacitance element on the semiconductor substrate 10; the second insulation film 16 being formed on the whole surface of base body including the polysilicon dummy layer 14; the lower electrode 18a having a recess form section in which the surface of its periphery situated over the polysilicon dummy layer 14 lies on a higher level than the surface of its center being formed on the second insulation film 16; the upper electrode 22 having a predetermined thickness of, e.g. about 10 to 300 nm, and the surface of upper electrode 22 being made lower than the surface of the periphery of lower electrode 18a situated over the polysilicon dummy layer 14. Thus, when the smoothing process in which $SiO_2$ film is piled on the whole surface of the base body, further coated with SOG film and then they are etched back, the smoothing insulation film 24 which fills the recess of lower electrode 18a with a recess form section to smooth the whole surface of base body covers the surface of upper electrode 22 at all times. Therefore, the upper electrode 22 and further the dielectric film 20 thereunder will never sustain damage due to the etching in the smoothing process. Consequently, it is possible to suppress the fluctuation in characteristics such as a capacitance value or the like of a capacitance element and the deterioration of reliability thereof, thus allowing a capacitance element having satisfactory characteristics and high reliability to be obtained.

Moreover, when the first and second via-holes 28a and 28b are respectively opened in order to form the first and second upper-layer wiring layers 30a and 30b connecting to the respective upper electrode 22 and lower electrode 18a of a capacitance element, a total film thickness of the inter-layer insulation film 27 on upper electrode 22 to be etched for opening the first via-hole 28a is thicker than a film thickness of the inter-layer insulation layer 26 on the periphery of lower electrode 18a to be etched for opening the second via-hole 28b. Thus, an excess overetching to the surface of upper electrode 22 will never take place and so the upper electrode 22 and $Ta_2O_2$ dielectric film 20 lying thereunder will never suffer damage. Therefore, it is possible to further suppress the fluctuation in characteristics such as a capacitance element or the like and the deterioration of reliability thereof, thus enabling capacitance element having better characteristics and higher reliability to be obtained.

Furthermore, in comparison between the first and second via-holes 28a and 28b, the depth of the second via-hole 28b opened on the lower electrode 18a is shallower than that of the first via-hole 28a on the upper electrode 22. Thus, of distances from an area where the upper electrode 22 and lower electrode 18a are opposed and which functions effectively as a capacitance element to the first and second upper-layer wiring layers 30a and 30b, the distance on the lower electrode side which generally tends to be longer than that on the upper electrode side is made shorter. Therefore, it is possible to reduce a difference in their impedances to suppress an increase of asymmetry in characteristics of a capacitance element, namely, improve a symmetry in characteristics thereof.

A Second Embodiment

Figure 10:
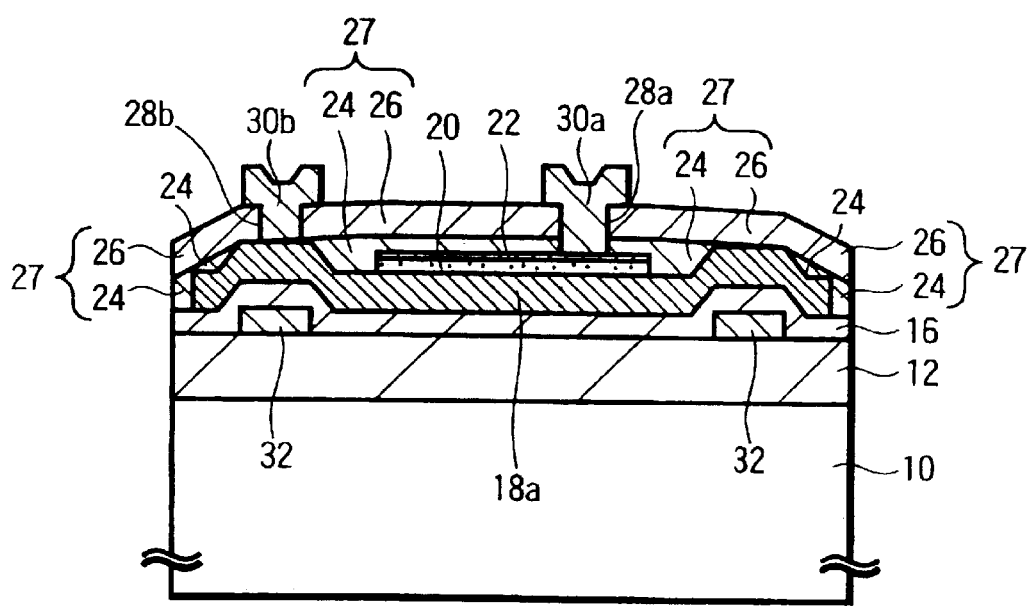
FIG. 10 is a schematic sectional diagram showing a capacitance element according to a second embodiment of the present invention.
Figure 11:
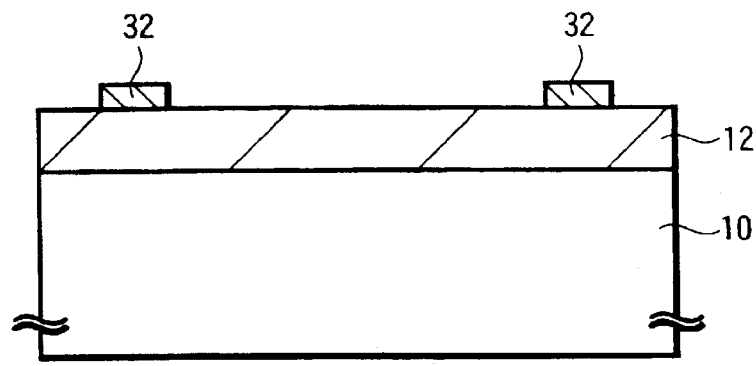
FIG. 11 is a schematic sectional process diagram (No.1) for explaining the method of fabricating the capacitance element shown in FIG. 10.
Figure 12:
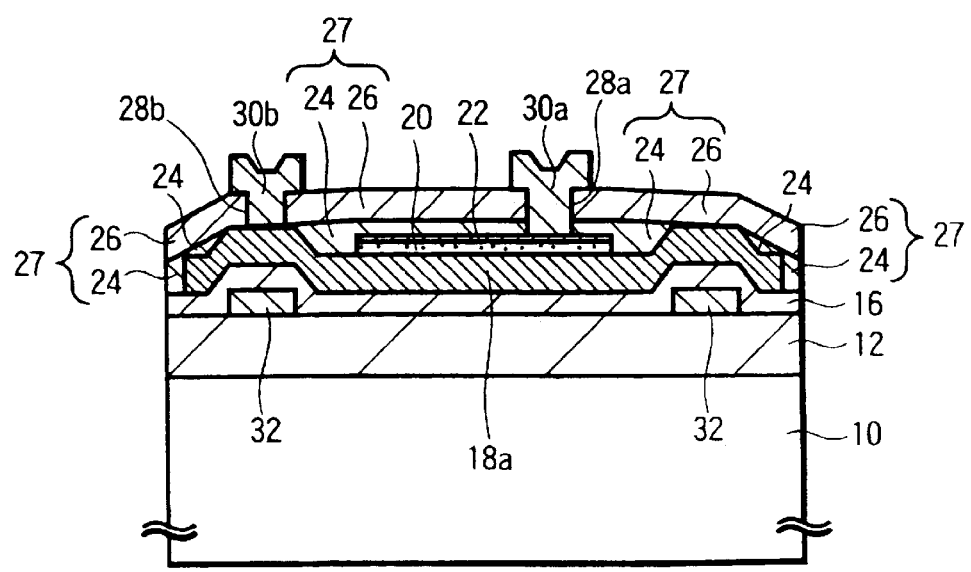
FIG. 12 is a schematic sectional process diagram (No.2) for explaining the method of fabricating the capacitance element shown in FIG. 10.

FIG. 10 is a schematic sectional diagram showing a capacitance element according to a second embodiment of the present invention. FIG. 11 and FIG. 12 are schematic sectional process diagrams for explaining a method of fabricating the capacitance element shown in FIG. 10, respectively. It is noted herein that the same elements as constituent elements of the capacitance element of the first embodiment shown in FIG. 1 to FIG. 9 are denoted by the same reference numerals and the description thereof is omitted.

As shown in FIG. 10, the capacitance element according to this embodiment is characterized by comprising a dummy layer 32 for making a level difference, which is an insulation dummy layer made of SiN, $SiO_2$ or the like having a predetermined thickness, for example, made of a SiN layer having a thickness of 100 to 500 nm or so, instead of the polysilicon dummy layer 14 for making a level difference in the capacitance element according to the first embodiment shown in FIG. 1. The other constituent elements are the same as in the case of the first embodiment.

Next, a method of fabricating the capacitance element shown in FIG. 10 will be described with reference to schematic sectional process diagrams of FIGS. 11 and 12.

To start with, as shown in FIG. 11, after the first insulation film 12 made of, e.g. a $SiO_2$ film is formed on the semiconductor substrate 10, on the first insulation film 12 is further formed an insulation film of a different kind from the first insulation film 12, e.g. a SiN film having a thickness of 100 to 500 nm or so. Subsequently, by the photolithographing process and etching process, the SiN film is selectively removed by etching into a predetermined pattern.

In this manner, a SiN dummy layer 32 made of a SiN film having a thickness of 100 to 500 nm or so is formed on the periphery of a predefined area of forming a capacitance element on the semiconductor substrate 10 through the first insulation film 12.

Next, as shown in FIG. 12, the second insulation film 16 is formed on the whole surface of the base body including the SiN dummy layer 32 in the same way as processes of the first embodiment shown in FIG. 3 to FIG. 9. On the second insulation film 16 is formed a TiN/Al—Si/Ti/TiON/Ti lamination film 18 on which an upper electrode 22 is formed through the dielectric film 20. By the photolithographing process and RIE process, the TiN/Al—Si/Ti/TiON/Ti lamination film 18 is patterned to form the lower electrode 18a having a recess form section in which the surface of its periphery situated over the SiN dummy layer 32 lies on a higher level than the surface of its center where the upper electrode 22 is formed.

In this way, the capacitance element comprised of the upper electrode 22 and lower electrode 18a that sandwich the dielectric film 20 between them is formed.

Note that the surface of the upper electrode 22 of the capacitance element at this time is lower in level than the surface of the periphery of lower electrode 18a situated over the SiN dummy layer 32.

Subsequently, $SiO_2$ film is piled on the whole surface of base body including the upper electrode 22 and lower electrode 18a and further coated with SOG film. Thereafter, the smoothing process to etch back these SOG film and $SiO_2$ film is executed to fill the recess of lower electrode 18a having a recess form section and also cover the surface of upper electrode 22 for forming the smoothing insulation film 24 that smooths the whole surface of base body.

It is noted that, in the smoothing process of the whole surface of base body, i.e. the forming process of the smoothing insulation film 24, the surface of upper electrode 22 formed on the center of lower electrode 18a with a recess form section is lower in level than the surface of the periphery of lower electrode 18a with a recess form section situated over the SiN dummy layer 32. Under a general smoothing etch-back condition an etch rate difference between $SiO_2$ and Ti or TiN is not great. Thus, when the SOG film and $SiO_2$ film are etched back, although the surface of the periphery of lower electrode 18a is exposed, the surface of upper electrode 22 is always covered with the smoothing insulation film 24 and will never be exposed by etching.

Subsequently, on the whole surface of base body including the periphery of lower electrode 18a and the smoothing insulation film 24 is piled the insulation film 26 made of, e.g. $SiO_2$ film to form the inter-layer insulation film 27 comprises of the smoothing insulation film 24 and the insulation film 26. Then, the inter-layer insulation on film 27 on upper electrode 22 is selectively removed etching and also the inter-layer insulation film 27 on the periphery of lower electrode 18a is selectively removed by etching for opening the first and second via-holes 28a and 28b. The TiN layer of the surface of lower electrode 18a may sometimes be removed.

It is noted that a total film thickness at this time of the inter-layer insulation film 27 on upper electrode 22 to be etched for opening the first via-hole 28a is thicker than a film thickness of the inter-layer insulation film 26 on the periphery of lower electrode 18a to be etched for opening the second via-hole 28b. For this reason, when these first and second via-holes 28a and 28b are opened, the surface of upper electrode 22 will never be subjected to an excess overetching.

Subsequently, the first and second upper-layer wiring layers 30a and 30b are formed, which are respectively connected to the upper electrode 22 and the periphery of lower electrode through the first and second via-holes 28a and 28b.

As described above, in this embodiment, the SiN dummy layer 32 having a predetermined thickness of e.g. 100 to 500 nm or so for making a level difference is formed on the periphery of a predefined area of forming the capacitance element on the semiconductor substrate 10 through the first insulation film 12; the second insulation film 16 being formed on the whole surface of base body including the SiN dummy layer 32; the lower electrode 18a having a recess form section in which the surface of its periphery situated over the SiN dummy layer 32 lies on a higher level than the surface of its center being formed on the second insulation film 16; and the upper electrode 22 being formed on the center through the dielectric film 20 so that the surface of upper electrode 22 being formed on the center through the dielectric film 20 so that the surface of upper electrode 22 may be lower in level than the surface of periphery of lower electrode 18a situated over the SiN dummy layer 32. Thus, when the smoothing process is executed, which etches back after $SiO_2$ film is piled on the whole surface of base body and further coated with SOG film, the smoothing insulation film 24 which smooths the whole surface of base body by filling the recess of lower electrode 18a having a recess form section covers the surface of upper electrode 22 at all times. Therefore, the upper electrode 22 and further the dielectric film 20 thereunder will never sustain damage due to the etching in smoothing process. In consequence, similarly to the case of the first embodiment, it is possible to suppress the fluctuation in characteristics such as a capacitance value or the like and the deterioration of reliability on a capacitance element, thus allowing a capacitance element with satisfactory characteristics and high reliability to be obtained.

Moreover, when the first and second via-holes 28a and 28b are opened so as to form the first and second upper-layer wiring layers 30a and 30b connected respectively to the upper electrode 22 and lower electrode 18a of the capacitance element, a total film thickness of the inter-layer insulation film 27 on the upper electrode 22 to be etched for opening the first via-hole 28a is thicker than a film thickness of the inter-layer insulation film on the periphery of lower electrode 18a to be etched for opening the second via-hole 28b. This means that an excess overetching to the surface of upper electrode 22 will never happen and so the upper electrode 22 and further the dielectric film 20 thereunder will never suffer damage. Therefore, just like the case of the first embodiment, it is possible to further suppress the fluctuation in characteristics such as a capacitance value or the like and the deterioration of reliability on a capacitance element, thus allowing a capacitance element with better characteristics and a higher reliability to be obtained.

Furthermore, the depth of the second via-hole 28b opened on the lower electrode 18a is shallower than the depth of the first via-hole 28a opened on the upper electrode 22. Due to this fact, of distances from an area where the upper electrode 22 and lower electrode 18a are opposed and which effectively functions as a capacitance element to the first and second upper-layer wiring layers 30a and 30b, a distance on the lower electrode side which generally tends to be longer than that on the upper electrode side is made shorter. For this reason, similarly to the case of the first embodiment, it is possible to suppress an increase of asymmetry in characteristics of a capacitance element by reducing the difference in their impedances and so improve symmetry in characteristics of the capacitance element.

Additionally, in the second embodiment, a SiN dummy layer 32 having a predetermined thickness of, e.g. 100 to 500 nm or so for making a level difference is formed on the periphery of a predefined area of forming a capacitance element on the semiconductor substrate 10 through the first insulation film 12. However, instead of forming such a SiN dummy layer 32, the first insulation film 12 in the center of the predefined area of forming a capacitance element on the semiconductor substrate 10 may selectively be removed by etching through the photolithographing process and etching process to form a recess having a depth of 100 to 500 nm or so. In addition, the selective etching of the first insulation film 12 may be combined with forming the dummy layer 32(or the dummy layer 14, a dummy layer 34 described below) so as to form a final dummy layer and thus form the recess having a depth of 100 to 500 nm or so.

In any of these cases, similarly to the case of the above second embodiment, it is possible to form the second insulation film 16 on the first insulation film 12 in which the recess with a depth of 100 to 500 nm or so is formed in the center of the predefined area of forming the capacitance element; form a TiN/Al—Si/Ti/TiON/Ti lamination film 18 on the second insulation from 16; pattern this TiN/Al—Si/Ti/TiON/Ti lamination film 18; and thereby form the lower electrode 18a having a recess form section in which the surface of its periphery lies on a higher level than the surface of its center situated above the recess formed on the first insulation film 12. Therefore, the same function and result as the case of the second embodiment can be effected.

A Third Embodiment

Figure 13:
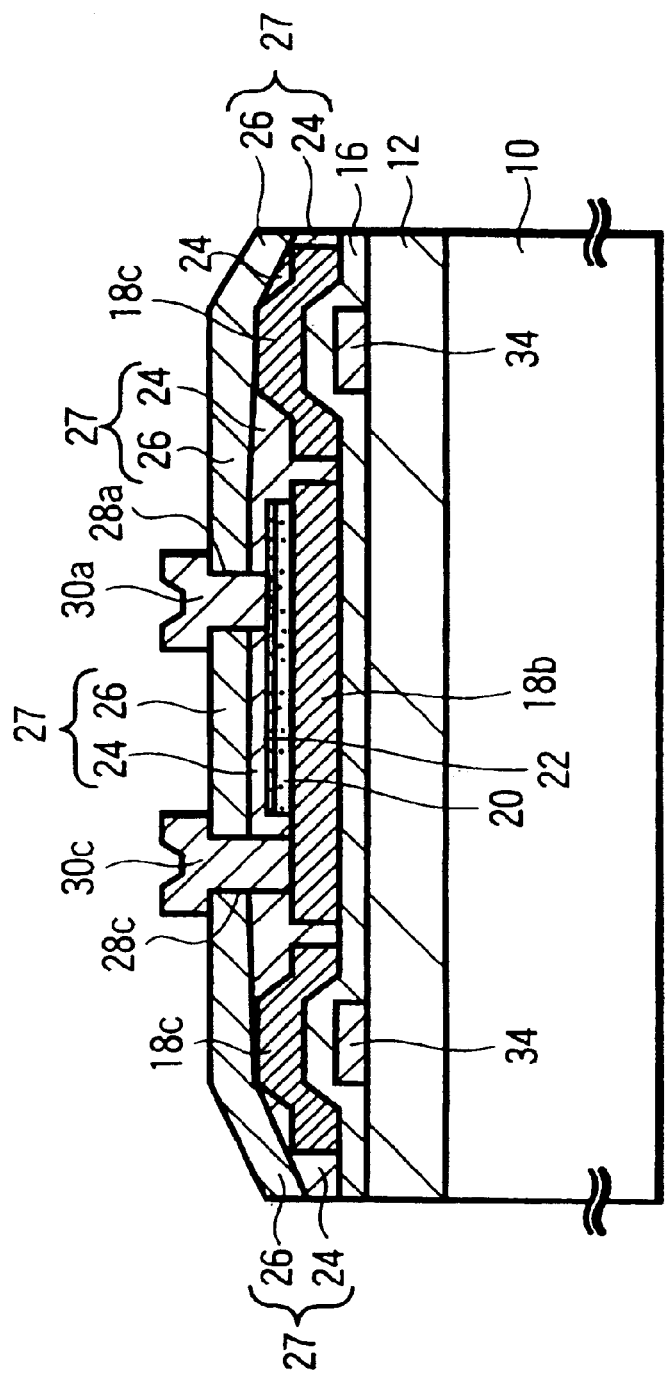
FIG. 13 is a schematic sectional diagram showing a capacitance element according to a third embodiment of the present invention.

FIG. 13 is a schematic sectional diagram showing a capacitance element according to a third embodiment of the present invention. FIG. 14 to FIG. 19 are schematic sectional process diagrams for explaining a method of fabricating the capacitance element shown in FIG. 13, respectively. It is noted herein that the same elements as constituent element of the capacitance element shown in FIG. 1 to FIG. 9 of the first embodiment are denoted by the same reference numerals to omit the description thereof.

As shown in FIG. 13, in comparison with the capacitance element of the first embodiment shown in FIG. 1, a capacitance element according to this embodiment is characterized in that, in stead of the polysilicon dummy layer 14 for making a level difference being formed on the periphery of a capacitance element, a polysilicon dummy layer 34 having the same thickness of, e.g. 100 to 500 nm or so for making a level difference is formed in the circumference of a capacitance element.

Moreover, it is also characterized in that, in stead of the lower electrode 18a with a recess form section made of, e.g. TiN/Al—Si/Ti/TiON/Ti multilayer of the first embodiment shown in FIG. 1, a lower electrode 18b having a flat surface and made of, e.g. TiN/Al—Si/Ti/TiON/Ti multilayer is formed. Separately from the lower electrode 18b, a dummy electrode 18c made of, e.g. TiN/Al—Si/Ti/TiON/Ti multilayer and having a higher surface than that of upper electrode 22 is formed over the polysilicon dummy layer 34 for making a level difference surrounding the capacitance element.

Thus, in contrast with the first embodiment in which the smoothing insulation film 24 filling the recess of lower electrode 18a with a recess form section covers the surface of upper electrode 22, the smoothing insulation film 24 in this embodiment filling the recess surrounded by the dummy electrode 18c covers the surface of upper electrode 22 formed above the lower electrode 18b.

The other constituent elements are nearly the same as in the first embodiment.

Next, a method of fabricating the capacitance element shown in FIG. 13 will be described with reference to schematic sectional process diagrams of FIG. 14 to FIG. 19.

Figure 14:
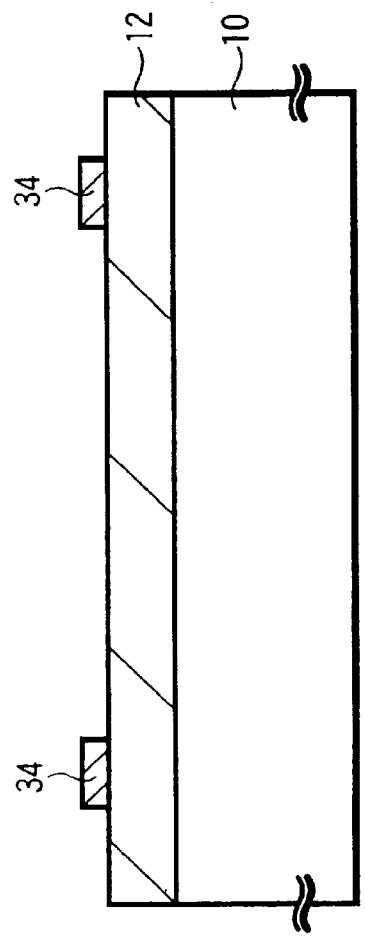
FIG. 14 is a schematic sectional process diagram (No.1) for explaining the method of fabricating the capacitance element shown in FIG. 13.

To start with, as shown in FIG. 14, after the first insulation film 12 made of, e.g. a SiO$_2$ film is formed on the semiconductor substrate 10, on the first insulation film 12 is further formed, e.g. a polysilicon layer having a predetermined thickness of, e.g. 100 to 500 nm or so. Subsequently, by the photolithographing process and RIE process, the polysilicon layer is selectively removed by etching into a predetermined pattern.

In this manner, the polysilicon dummy layer 34 made of a polysilicon layer with a thickness of 100 to 500 nm or so is formed on the periphery of the predefined area of forming the capacitance element on the semiconductor substrate 10 through the first insulation film 12.

Note that the forming process of the polysilicon dummy layer 34 can be combined with the forming process of polysilicon layers used as a gate electrode of other element, e.g. MOSTr, a resistance layer of a resistance element, and an electrode of BipTr in LSI.

Figure 15:
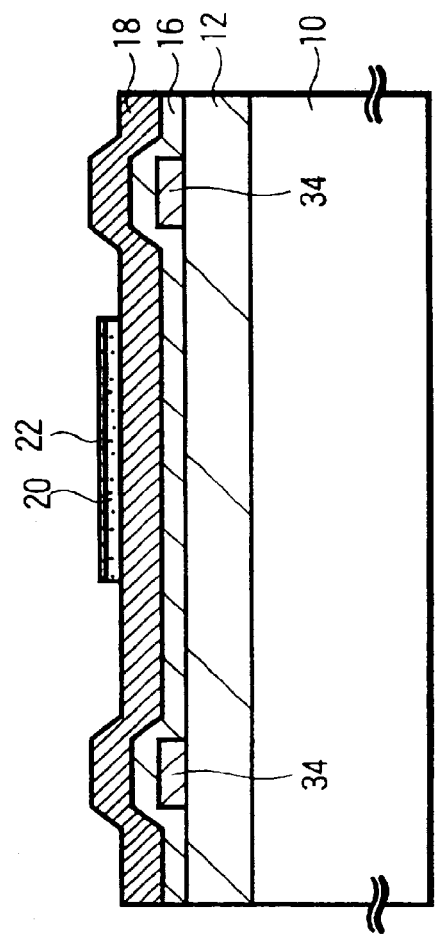
FIG. 15 is a schematic sectional process diagram (No.2) for explaining the method of fabricating the capacitance element shown in FIG. 13.

Next, as shown in FIG. 15, in the same way as processes of the first embodiment shown in FIG. 3 to FIG. 5, the second insulation film 16 is formed on the whole surface of the base body including the polysilicon dummy layer 34 for making a level difference. The insulation film 16 may be omitted to form. Then, on the second insulation film 16 is formed TiN/Al—Si/Ti/TiON/Ti lamination film or a layered film made of Cu, Al—Cu and the like, in this embodiment a TiN/Al—Si/Ti/TiON/Ti lamination film 18. On the TiN/Al—Si/Ti/TiON/Ti lamination film 18 is formed the upper electrode 22 made of a Ti layer, a TiN layer or a Ti/TiN layered film through the dielectric film 20 made of Ta$_2$O$_5$, SiO$_2$, SiN and the like, in this embodiment Ta$_2$O$_5$.

Additionally, the surface of upper electrode 22 at this time is lower in level than the top surface of the TiN/Al—Si/Ti/TiON/Ti lamination film 18 situated over the polysilicon dummy layer 34.

Figure 16:
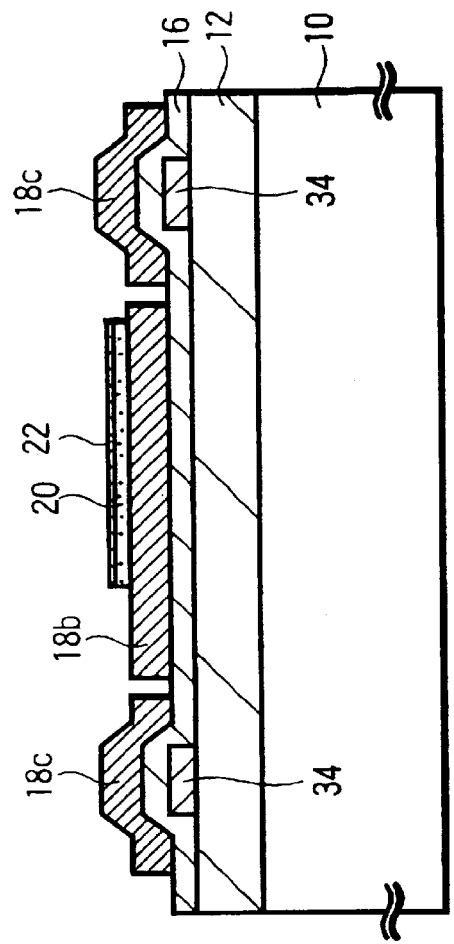
FIG. 16 is a schematic sectional process diagram (No.3) for explaining the method of fabricating the capacitance element shown in FIG. 13.

Next, as shown in FIG. 16, through the photolithographing process and RIE process, the TiN/Al—Si/Ti/TiON/Ti lamination film 18 is selectively removed by etching into a predetermined pattern.

In this way, the lower electrode 18b made of a TiN/Al—Si/Ti/TiON/Ti lamination film is formed in the predefined area of forming the capacitance element on the second insulation film 16 and also, separately from the lower electrode 18b, the dummy electrode 18c made of the TiN/Al—Si/Ti/TiON/Ti lamination film is formed over the polysilicon dummy layer 34 surrounding the predefined area of forming the capacitance element. The dummy layer 18c has the top surface higher than the surface of lower electrode 18b.

Simultaneously with forming the lower electrode 18b, a lower-layer wiring layer (not shown) made of the TiN/Al—Si/Ti/TiON/Ti lamination film of other element in LSI is formed.

The capacitance element comprised of the upper electrode 22 and lower electrode 18b that sandwich the dielectric film 20 between them is thus formed.

Note that the surface of upper electrode 22 of capacitance element at this time is lower in level than the top surface of dummy electrode 18c surrounding the area forming the capacitance element and lying over the polysilicon dummy layer 34.

Figure 17:
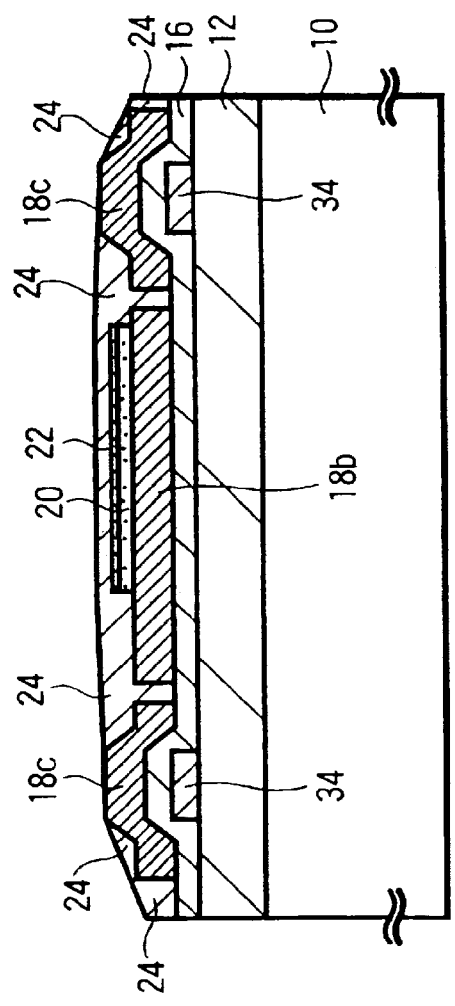
FIG. 17 is a schematic sectional process diagram (No.4) for explaining the method of fabricating the capacitance element shown in FIG. 13.

Next, as shown in FIG. 17, a SiO$_2$ film having a thickness of 300 to 1500 nm or so is piled on the whole surface of base body including the upper electrode 22 and lower electrode 18b and is further coated with a SOG film. Thereafter, the smoothing process to etch back these SOG film and SiO$_2$ film takes place.

In this manner, the smoothing insulation film 24 is formed, which smooths the whole surface of base body by filling the recess surrounded by dummy electrode 18c and also covering the surface of upper electrode 22 and lower electrode 18b.

Additionally, in the process of smoothing the whole surface of base body, i.e. the process of forming the smoothing insulation film 24, the surface of upper electrode 22 formed on the lower electrode 18b is lower in level than the top surface of dummy electrode 18c surrounding the area of forming the capacitance element and lying over the polysilicon dummy layer 34. For this reason, when the SOG film and SiO$_2$ film are etched back, the surface of lower electrode 18b and also the surface of upper electrode 22 are always covered with the smoothing insulation film 24 and will never be exposed by etching.

Figure 18:
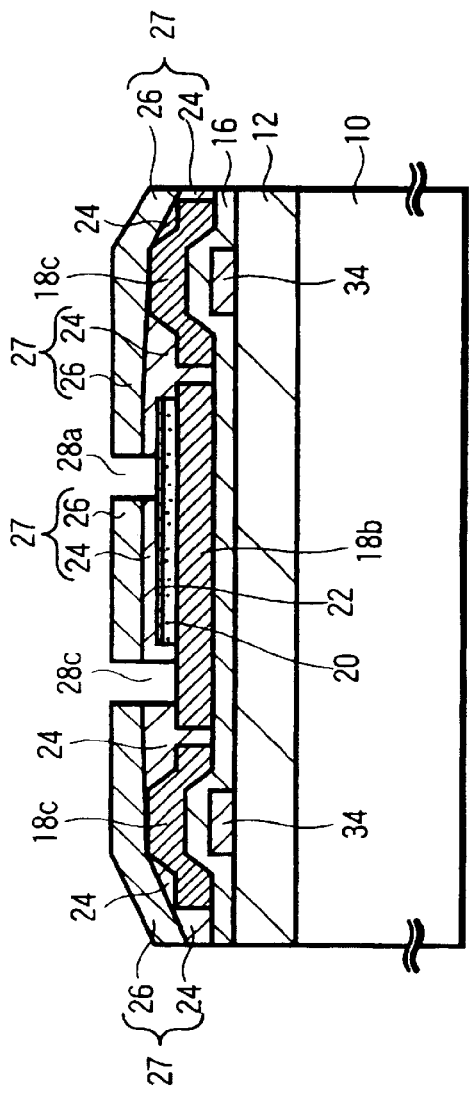
FIG. 18 is a schematic sectional process diagram (No.5) for explaining the method of fabricating the capacitance element shown in FIG. 13.

Next, as shown in FIG. 18, using the plasma CVD method for example, on the whole surface of base body including the dummy electrode 18c and smoothing insulation film 24 is piled the inter-layer insulation film 27.

Subsequently, using the photolithographing process and dry etching method, the inter-layer insulation film 27 on the upper electrode 22 and lower electrode 18b is selectively removed by etching to open the first and second via-holes 28a and 28c.

Figure 19:
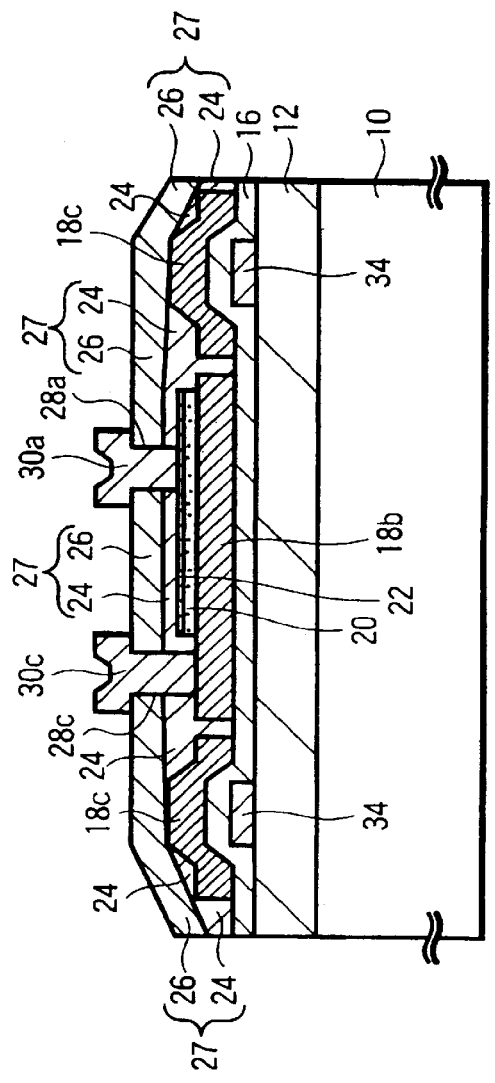
FIG. 19 is a schematic sectional process diagram (No.6) for explaining the method of fabricating the capacitance element shown in FIG. 13.

Next, as shown in FIG. 19, after, e.g. Al-alloy layer is piled by the sputtering method for example, the Al-alloy layer is processed, using the photolithographing process and dry etching method, to form the first and second upper-layer wiring layers 30a and 30c made of the Al-alloy layer and each connected to the upper electrode 22 and the periphery of lower electrode 18b through the first and second via-holes 28a and 28c.

Also, simultaneously with forming the first and second upper-layer wiring layers 30a and 30c, upper layer wiring layers (not shown) of other elements in LSI are formed.

As described above, in this embodiment, the polysilicon dummy layer 34 having a thickness of 100 to 500 nm or so for making a level difference is formed on the periphery of the predefined area of forming the capacitance element on the semiconductor substrate 10 through the first insulation film 12; the lamination film 18 made of, e.g. a TiN/Al—Si/Ti/TiON/Ti multilayer being formed on the whole surface of base body including the polysilicon dummy layer 34 through the second insulation film 16 to be patterned into a predetermined shape, thereby forming the lower electrode 18b made of the TiN/Al—Si/Ti/TiON/Ti multilayer in the predefined area of forming the capacitance element; and the dummy electrode 18c made of the TiN/Al—Si/Ti/TiON/Ti multilayer having the surface higher than the surface of lower electrode 18b being formed over the polysilicon dummy layer 34 surrounding the lower electrode 18b. At the same time, the upper electrode 22 is formed on the lower electrode 18b through the dielectric film 20 so that the surface of upper electrode 22 may be lower in level than the top surface of dummy electrode 18c situated over the polysilicon dummy layer 34. Thus, when SiO$_2$ film that is piled on the whole surface of base body and further coated with SOG film is etched back to perform the smoothing process the smoothing insulation film 24 which fills the recess surrounded by the dummy electrode 18c to smooth the whole surface of base body covers the surface of upper electrode 22 at all times. For this reason, the upper electrode 22 and further the dielectric film 20 lying thereunder will never sustain damage due to etching in the smoothing process. Therefore, similarly to the case of the first embodiment, it is possible to suppress the fluctuation in characteristics such as a capacitance value or the like and the deterioration of reliability of a capacitance element, thus enabling a capacitance element having satisfactory characteristics and high reliability to be obtained.

Additionally, in the first to third embodiments described above, the case where the lower electrode 18a or 18b is connected to the second upper-layer wiring layer 30b or 30c through the second via-hole 28b or 28c is described. However, there are cases where the lower electrode 18a or 18b also serve as a wiring layer and connect to other element in LSI.

In this case, it is unnecessary that the inter-layer insulation film 27 on the lower electrode 18a or 18b is selectively removed by etching to open the second via-hole 28b or 28c.

Moreover, the first and second upper-layer wiring layers 30a, 30b or 30c may be formed in the following way. After a W (tungsten)-layer is piled using the CVD method instead of piling and processing the Al-alloy layer, the W layer is etched back to form a W-plug which fills the first and second via-holes 28a, 28b or 28c. Further, an Al-alloy layer is piled by the sputtering method and then the Al-alloy layer is processed using the photolithographing process and dry etching method to form the first and second upper-layer wiring layers which connect to the W-plug inside the first and second via-holes 28a, 28b or 28c.

A Fourth Embodiment

Figure 20:
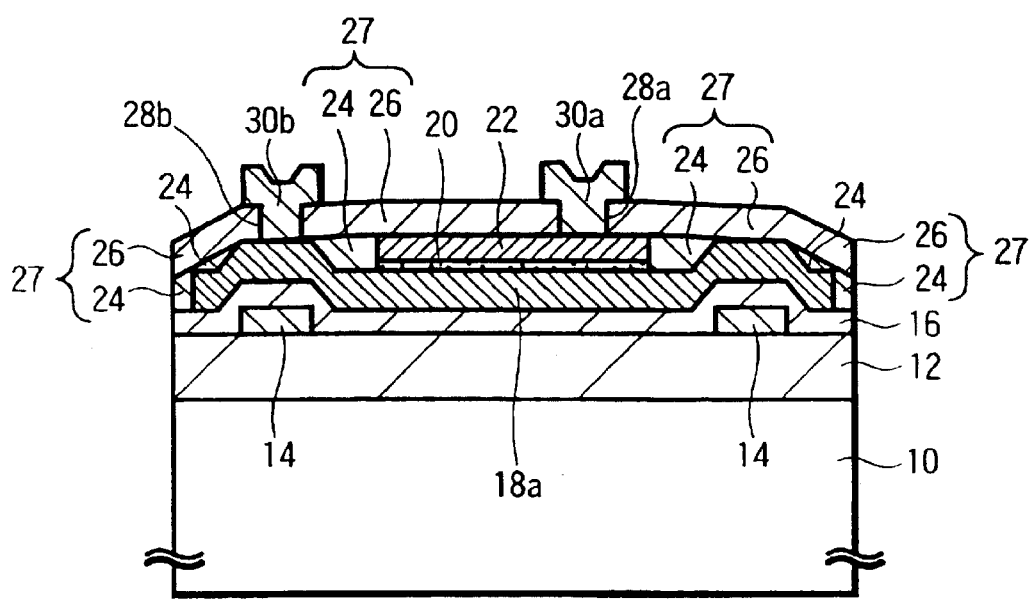
FIG. 20 is a schematic sectional diagram showing a capacitance element according to a fourth embodiment of the present invention.

FIG. 20 is a schematic sectional diagram showing a capacitance element according to a fourth embodiment of the present invention. FIG. 21 to FIG. 28 are schematic sectional process diagrams for explaining a method of fabricating the capacitance element shown in FIG. 20.

As shown in FIG. 20, in the capacitance element according to this embodiment, the polysilicon dummy layer 14 made of a polysilicon layer having a predetermined thickness of, e.g. 100 to 500 nm or so for making a level difference is formed on the periphery of the predefined area of forming the capacitance element on the semiconductor substrate 10 through the first insulation film 12 made of, e.g. a SiO$_2$ film. On the first insulation film 12 and the polysilicon dummy layer 14 is formed the second insulation film 16. Additionally, the second insulation film 16 can be dispensed with.

Further, on the second insulation film 16 is formed the lower electrode 18a made of the TiN/Al—Si/Ti/TiON/Ti lamination film or Cu, Al—Cu and the like. The lamination film is such that a Ti layer having a thickness of, e.g. about 5 to 70 nm, a TiON layer having a thickness of, e.g. about 10 to 200 nm, a Ti layer having a thickness of, e.g. about 300 to 1500 nm, and a TiN layer having a thickness of, e.g. about 5 to 70 nm are piled in turn from below. In this embodiment, the lower electrode 18a of TiN/Al—Si/Ti/TiON/Ti lamination film is formed.

In other words, in the lower electrode 18a having a recess form section, the surface of its periphery situated over the polysilicon dummy layer 14 having a thickness of, e.g. 100 to 500 nm or so for making a level difference lies on a higher level than the surface of its center by 100 to 500 nm or so.

It is noted that, in the lower electrode 18a having such a Tin/Al—Si/Ti/TiON/Ti multilayer structure, the uppermost TiN layer functions as an antireflection coating in the photolithographing step during the fabrication process and as an antioxidation film of the Al—Si layer thereunder. The Al—Si layer functions as the principal part of the electrode needing a conductive characteristic. The lower Ti/TiON/Ti lamination film functions as a barrier metal.

Moreover, on the center of lower electrode 18a is formed the upper electrode 22 having a thickness of 5 to 100 nm or so, made of a Ti layer, a TiN layer or a Ti/TiN layered film, through the dielectric film 20 having a predetermined thickness of, e.g. 10 to 300 nm or so and made of Ta$_2$O$_5$, SiO$_2$, SiN or the like, in this embodiment Ta$_2$O$_5$ dielectric film. When the dielectric film 20 is made of Ta$_2$O$_5$, it is preferable to form the upper electrode 22 out of a TiN layer or a layered film in which TiN and Ti are piled in this order those being hard to react with oxygen. When the dielectric film 20 is made of SiO$_2$, SiN and the like, the upper electrode 22 can be formed out of a Ti layer, a TiN layer or a TiN/Ti layered film. In this way, the capacitance element is formed from the upper electrode 22 and lower electrode 18a which sandwich the dielectric film 20 between them.

Then, the surface of dielectric film 20 formed on the center of lower electrode 18a with a recess form section of the capacitance element is lower in level than the surface of the periphery of lower electrode 18a with a recess form section situated over the polysilicon dummy layer 14.

Furthermore, the smoothing process to smooth unevenness of the surface of base body including the upper electrode 22 and lower electrode 18a takes place. Specifically, using the plasma CVD method for example, taking the TEOS as a raw material, the smoothing insulation film 24 made of $SiO_2$ film piled on the whole surface of base body and SOG film coated thereon is formed. The smoothing insulation film 24 fills the recess of the lower electrode 18a having a recess form section.

Also, on the whole surface of the smoothed base body, namely, on the periphery of lower electrode 18a and the smoothing insulation film 24, the insulation film 26 made of, e.g. $SiO_2$ film is piled. The smoothing insulation film 24 and the insulation film, 26 form the inter-layer insulation film 27 together.

In addition, the first upper-layer wiring layer 30a made of, e.g. an Al-alloy layer and connected to the upper electrode 22 is formed through the first via-hole 28a opened in the inter-layer insulation film 27 on the upper electrode 22.

Also, the second upper-layer wiring layer 30b made of, e.g. an Al-alloy layer and connected to the periphery of lower electrode 18a is formed through the second via-hole 28b opened in the inter-layer insulation film 27 on the periphery of lower electrode 18a.

Next, a method of fabricating the capacitance element shown in FIG. 20 will be described with reference to schematic sectional process diagrams of FIG. 21 to FIG. 28.

Figure 21:
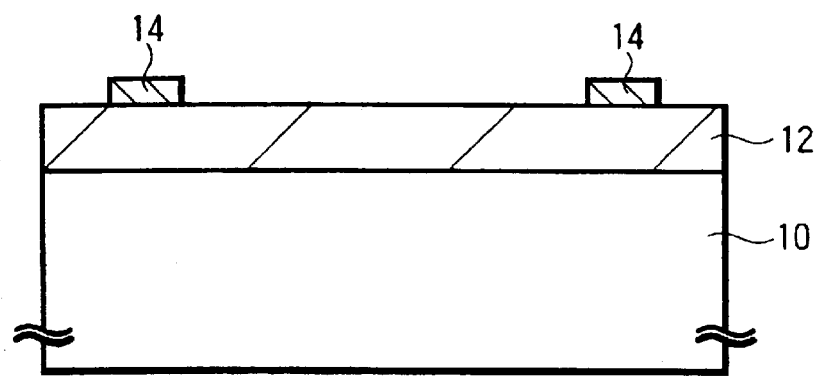
FIG. 21 is a schematic sectional process diagram (No.1) for explaining the method of fabricating the capacitance element shown in FIG. 20.

Initially, as shown in FIG. 21, after the first insulation film 12 made of, e.g. $SiO_2$ film is formed on the semiconductor substrate 10, further on the first insulation film 12 is formed, e.g. a polysilicon layer having a predetermined thickness of, e.g. 100 to 500 nm. Subsequently, by the photolithographing process and RIE process, the polysilicon layer is selectively removed by etching to pattern into a predetermined shape.

In this manner, the polysililcon dummy layer 14 made of a polysilicon layer having a thickness of 100 to 500 nm or so is formed on the periphery of the predefined area of forming the capacitance element on the semiconductor substrate 10 though the first insulation film 12.

It is noted that the forming process of the polysilicon dummy layer 14 can be combined with the forming process of a polysilicon layer used as a gate electrode of other element, e.g. MOSTr(metal oxide semiconductor transistor), a resistance layer of a resistance element, and an electrode of BipTr (bipolar transistor) in LSI.

Figure 22:
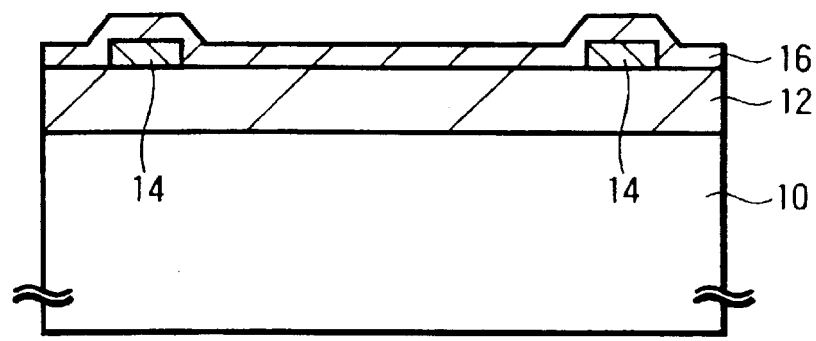
FIG. 22 is a schematic sectional process diagram (No.2) for explaining the method of fabricating the capacitance element shown in FIG. 20.

Next, as shown in FIG. 22, on the whole surface of base body including the polysilicon dummy layer 14 for making a level difference is formed the second insulation film 16. Note that the second insulation film 16 can be omitted to form.

Figure 23:
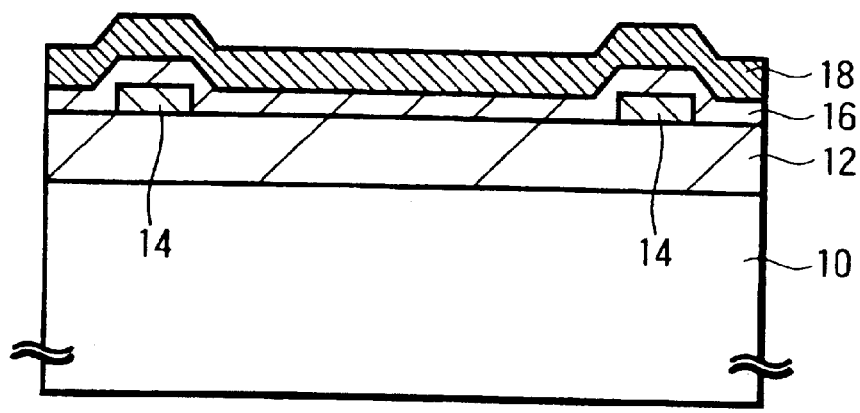
FIG. 23 is a schematic sectional process diagram (No.3) for explaining the method of fabricating the capacitance element shown in FIG. 20.

Next, as shown in FIG. 23, using the sputtering method for example, on the second insulation film 16 is formed a conductor film having a predetermined thickness, e.g. the TiN/Al—Si/Ti/TiON/Ti lamination film 18 in which a Ti layer having a thickness of 5 to 70 nm or so, a TiON layer having a thickness 10 to 200 nm or so, a Ti layer having a thickness of 5 to 70 nm or so, a Al—Si layer having a thickness of 300 to 1500 nm or so, and a TiN layer having a thickness of 5 to 70 nm or so are piled in turn from below.

Additionally, in such a multi-layered structure, the uppermost TiN layer functions as an antireflection coating in the photolithographing step during fabrication process and as an antioxidation film of the Al—Si layer thereunder. The Al—Si layer functions as the principal part of the electrode requiring a conductive characteristic. The lower Ti/TiON/Ti lamination film functions as a barrier metal.

Again, in the TiN/Al—Si/Ti/TiON/Ti lamination film 18, its surface over the polysilicon dummy layer 14 with a thickness of 100 to 500 nm for making a level difference is higher than the surface of an area surrounded by the polysilicon dummy layer 14 by 100 to 500 nm or so.

Figure 24:
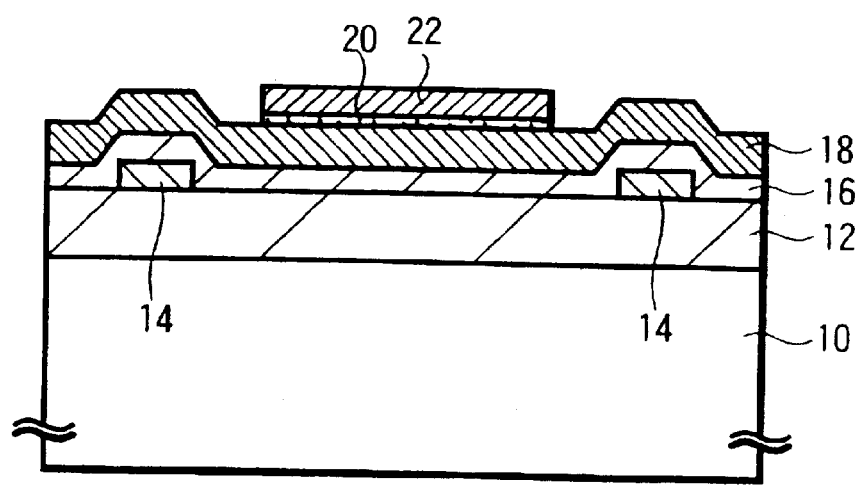
FIG. 24 is a schematic sectional process diagram (No.4) for explaining the method of fabricating the capacitance element shown in FIG. 20.

Next, as shown in FIG. 24, using the CVD method for example, on the TiN/Al—Si/Ti/TiON/Ti lamination film 18 is piled the dielectric film 20 made of $Ta_2O_5$, $SiO_2$, SiN or the like, in this embodiment $Ta_2O_5$ dielectric film 20 having a predetermined thickness of, e.g. 10 to 300 nm or so. Further, using the sputtering method for example, on the dielectric film is piled a conductor layer made of, e.g. a Ti layer, a TiN layer, or a Ti/TiN layered film having a predetermined thickness of, e.g. 20 to 500 nm or so.

Subsequently, via the photolithographing process and RIE process, these layered conductor layer and dielectric film are selectively removed by etching into a predetermined pattern.

In this way, on the TiN/Al—Si/Ti/TiON/Ti lamination film 18 in an area surrounded by the polysilicon dummy layer 14 for making a level difference, there is formed the upper electrode 22 made of a Ti layer, a TiN layer or a Ti/TiN layered film having a thickness of 20 to 500 nm or so through the dielectric film 20 having a thickness of 10 to 300 nm or so. The surface of upper electrode 22 is made equal to or higher than in level, the surface of lamination film 18 situated over the dummy layer 14.

Note that the surface of dielectric film 20 at this time is lower in level than the surface of lamination film 18 situated over the polysilicon dummy layer 14.

Figure 25:
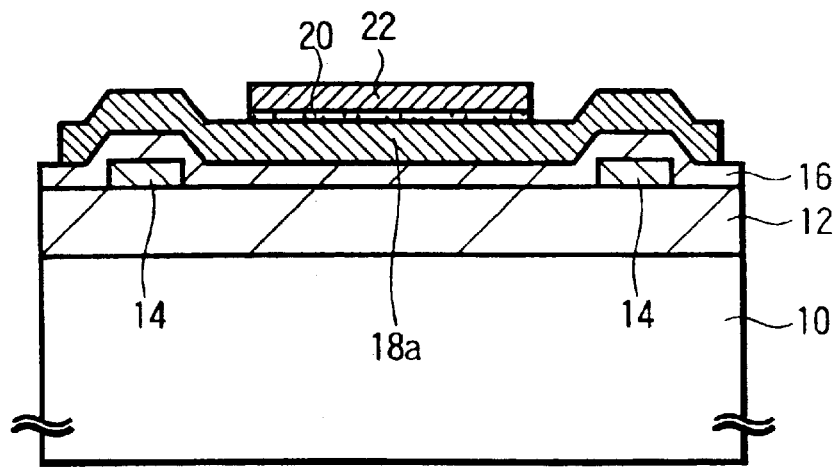
FIG. 25 is a schematic sectional process diagram (No.5) for explaining the method of fabricating the capacitance element shown in FIG. 20.

Next, as shown in FIG. 25, via the photolithographing process and RIE process, the TiN/Al—Si/Ti/TiON/Ti lamination film 18 is selectively removed by etching into a predetermined pattern.

In this manner, the lower electrode 18a made of the TiN/Al—Si/Ti/TiON/Ti lamination film having a recess form section in which the surface of its periphery over the polysilicon dummy layer 14 for making a level difference lies on a higher level than the surface of dielectric film 20 in its center having the upper electrode 22 formed thereon, is formed. Also, simultaneously with the formation of lower electrode 18a, a lower layer wiring layer (not shown) made of a TiN/Al—Si/Ti/TiON/Ti lamination film of other element in LSI is formed.

The capacitance element comprised of the upper electrode 22 and lower electrode 18a which sandwich the dielectric film 20 between them is thus formed.

Additionally, the surface of dielectric film 20 in the capacitance element at this time is lower in level than the surface of the periphery of lower electrode 18a located over the polysilicon dummy layer 14.

Figure 26:
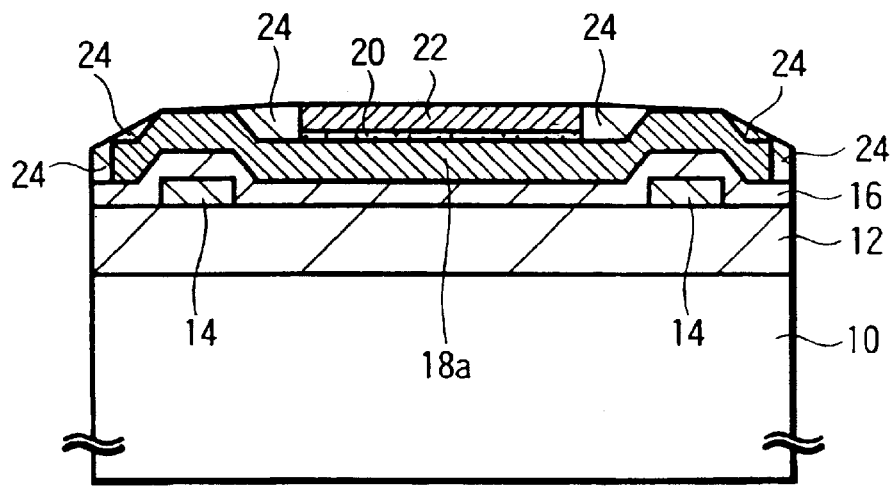
FIG. 26 is a schematic sectional process diagram (No.6) for explaining the method of fabricating the capacitance element shown in FIG. 20.

Next, as shown in FIG. 26, the smoothing process to smooth unevenness of the whole surface of base body is carried out. Specifically, using the plasma CVD method for example, taking the TEOS as a raw material, on the whole surface of base body including the upper electrode 22 and lower electrode 18a is piled, for example, a $SiO_2$ film up to a thickness of 300 to 1500 nm or so. Further, the $SiO_2$ film is coated with a SOG film. Thereafter, these SOG film and $SiO_2$ film are etched back.

In this way, the smoothing insulation film 24 which fills the recess of lower electrode 18a with a recess form section and smooths the whole surface of base body is formed.

It is noted that, in the smoothing process of the whole surface of base body, i.e. the formation process of the smoothing insulation film 24, the surface of dielectric film 20 formed on the center of lower electrode 18a with a recess form section is lower in level than the surface of the periphery of lower electrode 18a with a recess form section located over the polysilicon dummy layer 14. Moreover, in a general smoothing etch-back, an etching rate of $SiO_2$ is not so different from that of Ti or TiN. Thus, when the SOG film and $SiO_2$ film are formed and then etched back, the surface of the periphery of lower electrode 18a is exposed, but the surface of dielectric film 20 will never be exposed by etching. In other words, the periphery of lower electrode 18a will serve as an etching stopper and so the dielectric film 20 under the upper electrode 22 will never sustain damage.

Figure 27:
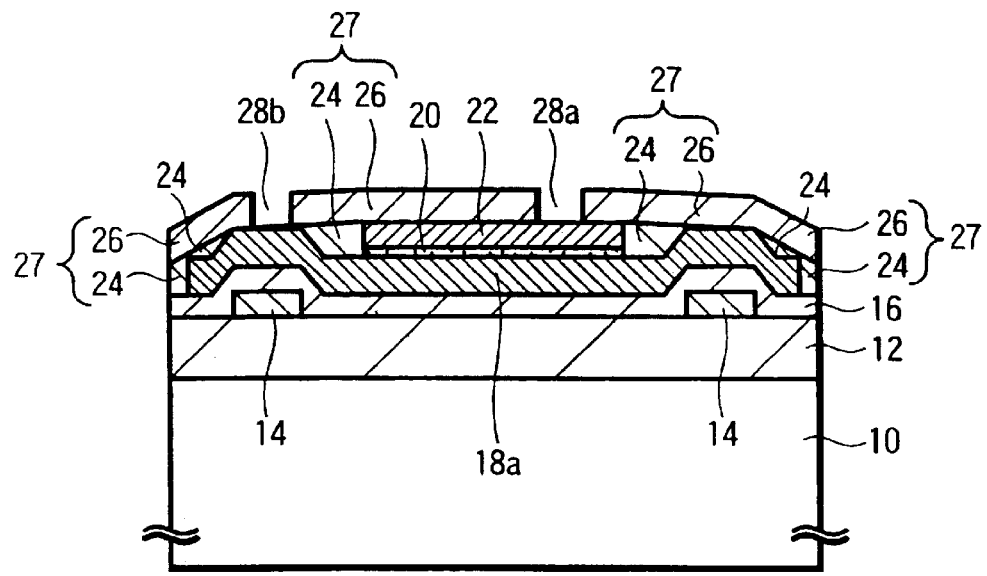
FIG. 27 is a schematic sectional process diagram (No.7) for explaining the method of fabricating the capacitance element shown in FIG. 20.

Next, as shown in FIG. 27, using the plasma CVD method for example, on the whole surface of base body including the periphery of lower electrode 18a and the smoothing insulation film 24 is piled the insulation film 26 made of, e.g. a $SiO_2$ film. The smoothing insulation film 24 and insulation film 26 form the inter-layer insulation film 27 together.

Subsequently, using the photolithographing process and dry etching method, the inter-layer insulation film 27 on upper electrode 22 is selectively removed by etching and also the inter-layer insulation film 27 on the periphery of lower electrode 18a is selectively removed etching for opening the first and second via-holes 28a and 28b. At this time, there may be a case where only the TiN layer on the surface of lower electrode 18a is removed so as to reduce a contact resistance.

It is noted that, on this occasion, a film thickness of the inter-layer insulation film 27 on upper electrode 22 to be etched for opening the first via-hole 28a is approximately equal to a film thickness of the inter-layer insulation film 27 on the periphery of lower electrode 18a to be etched for opening the second via-hole 28b. For this reason, when these first and second via-holes 28a and 28b are opened, an excess over-etching to the surface of upper electrode 22 will never happen.

Figure 28:
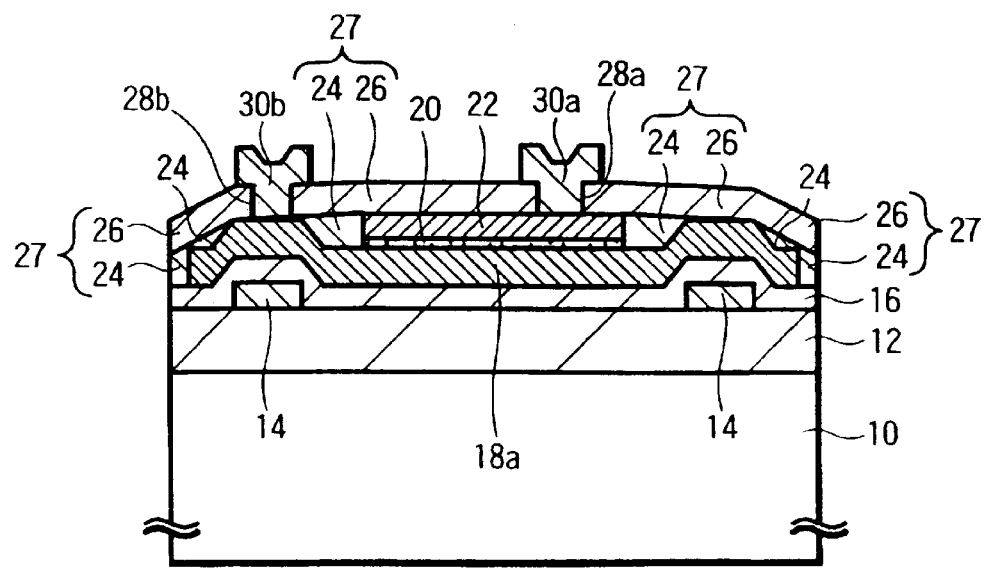
FIG. 28 is a schematic sectional process diagram (No.8) for explaining the method of fabricating the capacitance element shown in FIG. 20.

Next, as shown in FIG. 28, for example, an Al-alloy layer is piled using the sputtering method and then the Al-alloy layer is processed using the photolithographing process and dry etching method in order to form the first and second upper-layer wiring layers 30a and 30b made of the Al-alloy layer connected to the upper electrode 22 and the periphery of lower electrode 18a through the first and second via-holes 28a and 28b.

Also, simultaneously with the formation of the first and second upper-layer wiring layers 30a and 30b, upper-layer wiring layers (not shown) of other element is LSI is formed.

As described above, in this embodiment, the polysilicon dummy layer 14 for making a level difference made of a polysilicon layer having a thickness of 100 to 500 nm or so is formed on the periphery of a predefined area of forming the capacitance element on the semiconductor substrate 10 through the first insulation film 12; the second insulation film 16 being formed on the whole surface of base body including the polysilicon dummy layer 14; the lower electrode 18a with a recess form section in which the surface of its periphery lies on a higher level than the surface of its center being formed on the insulation film 16; the upper electrode 22 having a predetermined thickness of, e.g. 5 to 100 nm or so being formed on the center of lower electrode 18a through the dielectric film 20 having a predetermined thickness of, e.g. 10 to 300 nm (that is, a dielectric film thinner than the dummy layer 14); and the surface of dielectric film 20 being made lower in level than the surface of the periphery of lower electrode 18a located over the polysilicon dummy layer 14. Thus, after the $SiO_2$ film is piled on the whole surface of base body and further coated with the SOG film, when the smoothing process to etch back them is carried out, the periphery of lower electrode 18a acts as an etching stopper and so the dielectric film 20 will never suffer damage due to etching. Therefore, it is possible to suppress the fluctuation in characteristics such as a capacitance value or the like and the deterioration of reliability on a capacitance element and thus obtain a capacitance element having satisfactory characteristics and a high reliability.

Moreover, when the first and second via-holes 28a and 28b are opened in order to form the first and second upper-layer wiring layers 30a and 30b which are connected to the upper electrode 22 and lower electrode 18a, respectively, a film thickness of the inter-layer insulation film 27 on the upper electrode 22 to be etched for opening the first via-hole 28a is approximately equal to a film thickness of the inter-layer insulation film 27 on the periphery of lower electrode 18a to be etched for opening the second via-hole 28b. For this reason, an excess overetching to the surface of upper electrode 22 will never be performed and so the upper electrode 22 and $Ta_2O_5$ dielectric film 20 thereunder will never sustain damage. Therefore, it is possible to further suppress the fluctuation in characteristics such as a capacitance value or the like and the deterioration of reliability on a capacitance element and thus obtain a capacitance element having better characteristics and higher reliability.

Furthermore, in comparison between the first and second via-holes 28a and 28b, the depth of the second via-hole 28b opened on the lower electrode 18a is shallower than the depth of the first via-hole 28a. Thus, of distances from the area where the upper electrode 22 and lower electrode 18a are opposed and which functions effectively as a capacitance element, to the first and second upper-layer wiring layer 30a and 30b, a distance on the lower electrode side which generally tends to be longer than a distance on the upper electrode side is made shorter. Therefore, it is possible to reduce a difference in their impedances and suppress an increase of asymmetry in characteristics of a capacitance element. In other words, it is possible to improve symmetry in characteristics of a capacitance element.

A Fifth Embodiment

Figure 29:
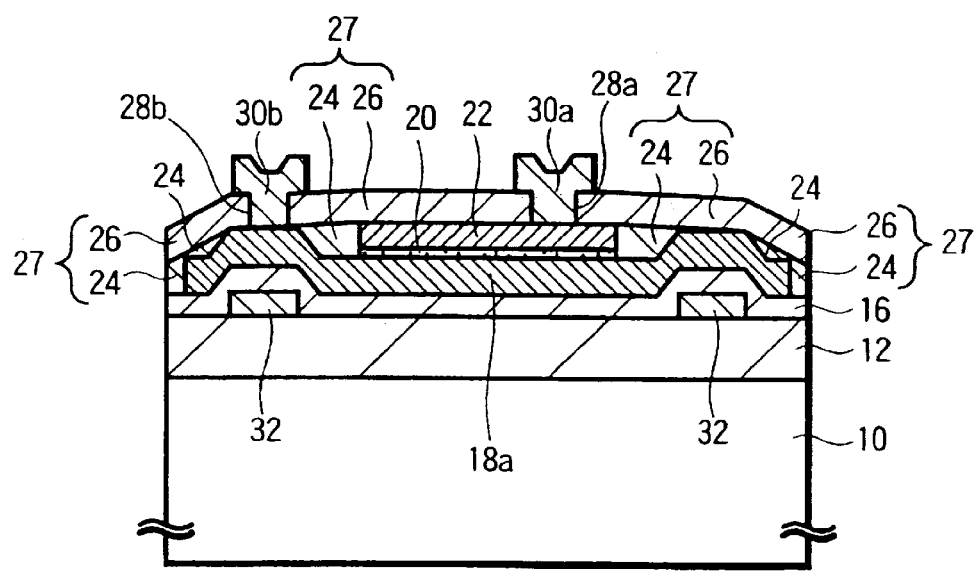
FIG. 29 is a schematic sectional diagram showing a capacitance element according to a fifth embodiment of the present invention.
Figure 30:
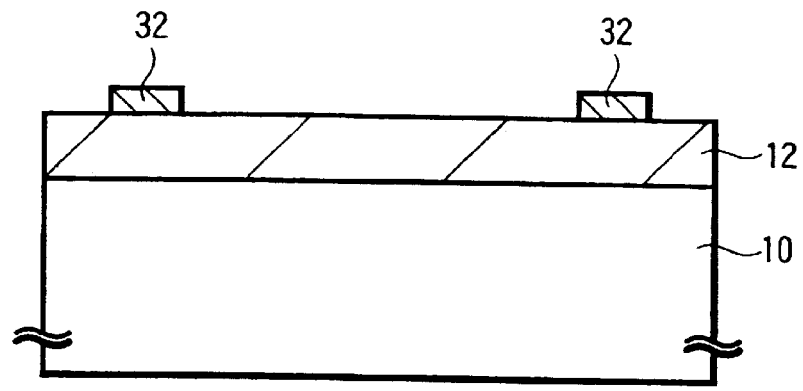
FIG. 30 is a schematic sectional process diagram (No.1) for explaining the method of fabricating the capacitance element shown in FIG. 29.
Figure 31:
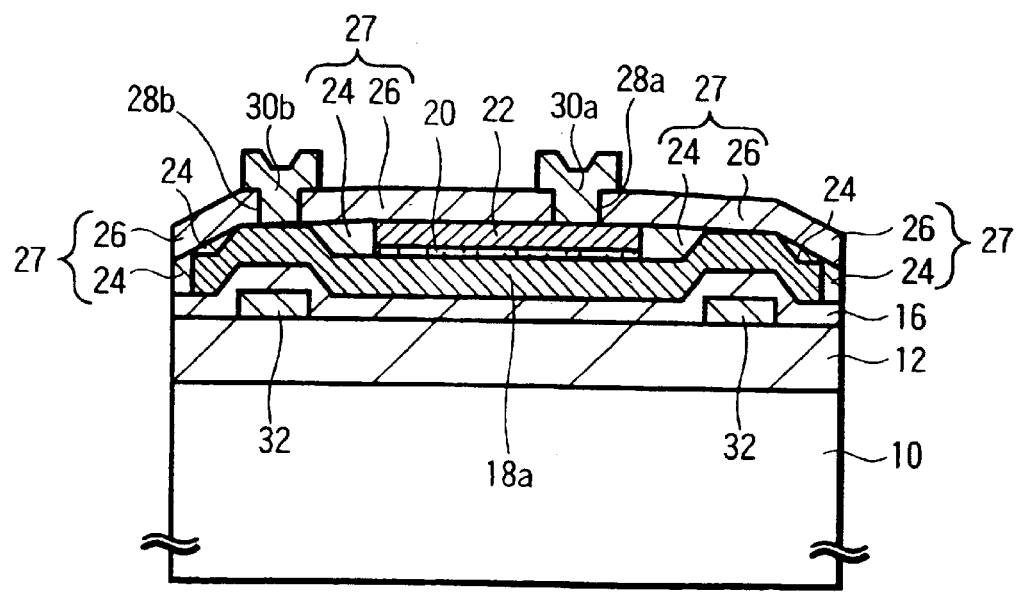
FIG. 31 is a schematic sectional process diagram (No.2) for explaining the method of fabricating the capacitance element shown in FIG. 29.

FIG. 29 is a schematic sectional diagram showing a capacitance element according to a fifth embodiment of the present invention. FIG. 30 and FIG. 31 are schematic sectional process diagrams for explaining a method of fabricating the capacitance element shown in FIG. 29. Additionally, the same elements as constituent elements of the capacitance element shown in FIG. 21 to FIG. 28 according to the fourth embodiment are denoted by the same reference numerals to omit at description thereof.

As shown in FIG. 29, the capacitance element according to this embodiment is characterized in that, instead of the polysilicon dummy layer 14 for making a level difference in the capacitance element shown in FIG. 20 according to the fourth embodiment, an insulation dummy layer made of SiN, $SiO_2$ and the like having a predetermined thickness, for example, a $SiO_2$ dummy layer 32 for making a level difference made of a $SiO_2$ layer having a thickness of 100 to 500 nm or so is formed. The other constituent elements are the same as those in the fourth embodiment.

Next, a method of fabricating the capacitance element shown in FIG. 29 with reference to schematic sectional process diagrams of FIG. 30 and FIG. 31.

To start with, as shown in FIG. 30, after the first insulation film 12 made of, e.g. a $SiO_2$ layer is formed on the semiconductor substrate 10, further on the first insulation film 12 is formed an insulation film, e.g. a $SiO_2$ film up to a thickness of 100 to 500 nm or so. Subsequently, by the photolithographing process and etching process, the SiO$_2$ film is selectively removed by etching into a predetermined pattern.

In this manner, the SiO$_2$ dummy layer 32 made of a SiO$_2$ film having a thickness of 100 to 500 nm or so is formed on the periphery of predefined area of forming the capacitance element on the semiconductor substrate 10 through the first insulation film 12.

Next, as shown in FIG. 31, in the same way as processes shown in FIG. 22 to FIG. 28 according to the fourth embodiment, the second insulation film 16 is formed on the whole surface of base body including the SiO$_2$ dummy layer 32; the TiN/Al—Si/Ti/TiON/Ti lamination film 18 being formed on the second insulation film 16; the upper electrode 22 being formed on the TiN/Al—Si/Ti/TiON/Ti lamination film 18 through the dielectric film 20; and the TiN/Al—Si/Ti/TiON/Ti lamination film 18 being patterned by the photolithographing process and RIE process to form the lower electrode 18a having a recess form section in which the surface of its periphery situated over the SiO$_2$ dummy layer 32 lies on a higher level than the surface of its center on which the upper electrode 22 is formed.

In this way, the capacitance element comprised of the upper electrode 22 and lower electrode 18a which sandwich the dielectric film 20 between them is formed.

Note that the surface of dielectric film 20 in the capacitance element at this moment is lower in level than the surface of the periphery of lower electrode 18a situated over the SiO$_2$ dummy layer 32.

Subsequently, on the whole surface of base body including the upper electrode 22 and lower electrode 18a is piled a SiO$_2$ film which is further coated with a SOG film. Thereafter, these SOG film and SiO$_2$ film are etched back for smoothing them to fill the recess of lower electrode 18a with a recess form section and also cover the surface of upper electrode 22. The smoothing insulation film 24 that smooths the whole surface of base body is thus formed.

It is noted that, in the smoothing process of the whole surface of base body, i.e. the forming process of the smoothing insulation film 24, the surface of dielectric film 20 formed on the center of lower electrode 18a with a recess form section is lower in level than the surface of the periphery of lower electrode 18a situated over the SiO$_2$ dummy layer 32. Under a general smoothing etch-back condition, the difference between etching rates of SiO$_2$ and Ti or TiN is not so large. For this reason, when the SOG film and SiO$_2$ film are etched back, the periphery of lower electrode 18a acts as an etching stopper. Thus, although the surface of the periphery of lower electrode 18a may be exposed, the surface of dielectric film 20 will never be exposed by etching.

Subsequently, on the whole surface of base body including the periphery of lower electrode 18a and the smoothing insulation film 24 is piled the insulation film 26 made of, e.g. a SiO$_2$ film to form the inter-layer insulation film 27 made of the smoothing insulation film 24 and insulation film 26. Then, the inter-layer insulation film 27 on upper electrode 22 is selectively removed by etching and also the inter-layer insulation film 27 on the periphery of lower electrode 18a is selectively removed by etching to open the first and second via-holes 28a and 28b. There may be a case where the TiN layer of the surface of lower electrode 18a is removed.

Additionally, at this time, a film thickness of the inter-layer insulation film 27 on upper electrode 22 to be etched for opening the first via-hole 28a is approximately equal to a film thickness of the inter-layer insulation film 26 on the periphery of lower electrode 18a to be etched for opening the second via-hole 28b. Therefore, when these first and second via-holes 28a and 28b are opened, an excess overetching to the surface of upper electrode 22 will never happen.

Subsequently, the first and second upper-layer wiring layers 30a and 30b which are respectively connected to the upper electrode 22 and the periphery of lower electrode 18a through the first and second via-holes 28a and 28b are formed.

As described above, in this embodiment, the SiO$_2$ dummy layer 32 having a predetermined thickness of, e.g. 100 to 500 nm or so for making a level difference is formed on the periphery of predefined area of forming the capacitance element on the semiconductor substrate 10 through the first insulation film 12; the second insulation film 16 being formed on the whole surface of base body including the SiO$_2$ dummy layer 32; the lower electrode 18a having a recess form section in which the surface of its periphery over the SiO$_2$ dummy layer 32 lies on a higher level than the surface of its center being formed; and the upper electrode 22 being formed on the center through the dielectric film 20 having the surface which is lower than the surface of the periphery of lower electrode 18a over the SiO$_2$ dummy layer 32. Therefore, when the SiO$_2$ film is piled on the whole surface of base body, further coated with SOG film and then processed to be smoothed by etching back, the periphery of lower electrode 18a acts as an etching stopper and so the dielectric film 20 will never sustain damage by etching. Consequently, similarly to the first embodiment, it is possible to suppress the fluctuation in characteristics such as a capacitance value or the like and the degradation of reliability on a capacitance element, thus allowing a capacitance element having satisfactory characteristics and high reliability to be obtained.

Moreover, when the first and second via-holes 28a and 28b are opened in order to form the first and second upper-layer wiring layers 30a and 30b which are respectively connected to the upper electrode 22 and lower electrode 18a of the capacitance element a film thickness of the inter-layer insulation film 27 on upper electrode 22 to be etched for opening the first via-hole 28a is nearly equal to a film thickness of the inter-layer insulation film 27 on the periphery of lower electrode 18a to be etched for opening the second via-hole 28b. For this reason, an excess overetching to the surface of upper electrode 22 will never take place and so the upper electrode 22 and the dielectric film 20 thereunder will never suffer damage. Therefore, just as in the first embodiment, it is possible to further suppress the fluctuation in characteristics such as a capacitance value or the like and the deterioration of reliability on a capacitance element thereby allowing a capacitance element having better characteristics and a higher reliability to be obtained.

Furthermore, the depth of the second via-hole 28b opened on the lower electrode 18a is approximately equal to the depth of the first via-hole 28a opened on the upper electrode 22. Thus, of distances from the area where the upper electrode 22 and lower electrode 18a are opposed and which functions effectively as a capacitance element to the first and second upper-layer wiring layers 30a and 30b, a distance on the lower electrode side which generally tends to be longer than that on the upper electrode side is made shorter. Therefore, similarly to the first embodiment, it is possible to reduce the difference between their impedances and suppress an increase of asymmetry in characteristics of a capacitance element, thus enabling symmetry in characteristics of a capacitance element to be improved.

Additionally, the above described fifth embodiment has the SiO$_2$ dummy layer 32 having a predetermined thickness of, e.g. 100 to 500 nm or so for making a level difference formed on the periphery of predefined area of forming a capacitance element on the semiconductor substrate 10 through the first insulation film 12.

However, instead of forming such a SiO$_2$ dummy layer 32, the first insulation layer 12 in the center of a predefined area of forming a capacitance element on the semiconductor substrate 10 may selectively be removed by etching through the photolithographing process and etching process to form a recess about 100 to 500 nm deep. In addition, the selective etching of the first insulation layer 12 may be combined with the dummy layer 32(or dummy layer 14 or dummy layer 34 described below to form a final dummy layer, whereby the recess about 100 to 500 nm in depth can also be formed.

In any of these cases, it will be possible to form the second insulation film 16 on the first insulation film 12 in which the recess about 100 to 500 nm deep is formed in the center of the predefined area of forming the capacitance element, in the same way as in the second embodiment; form the TiN/Al—Si/Ti/TiON/Ti lamination film 18 on the second insulation film 16; and pattern the TiN/Al—Si/Ti/TiON/Ti lamination film 18 to form the lower electrode 18a having a recess form section in which the surface of its periphery lies on a higher level than the surface of its center located above the recess formed on the first insulation film 12. Therefore, the same effect as in the above fifth embodiment can be achieved.

A Sixth Embodiment

Figure 32:
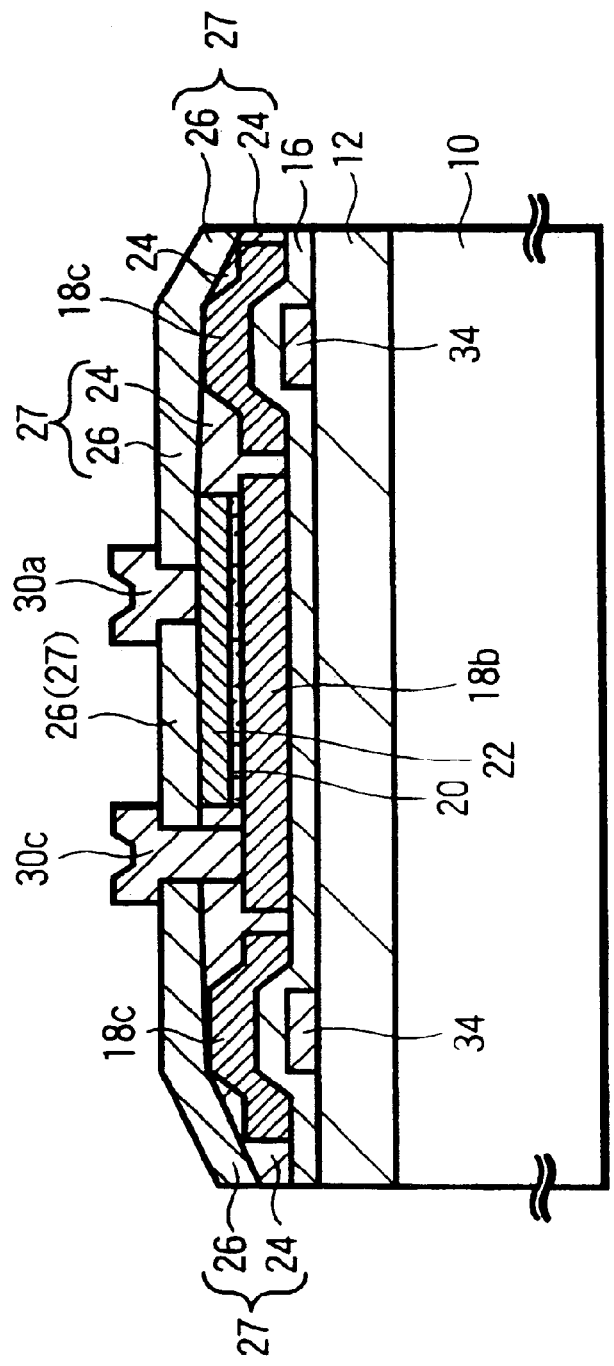
FIG. 32 is a schematic sectional diagram showing a capacitance element according to a sixth embodiment of the present invention.

FIG. 32 is a schematic sectional diagram showing a capacitance element according to a sixth embodiment of the present invention. FIG. 33 to FIG. 38 are each a schematic sectional process diagram for explaining a method of fabricating the capacitance element shown in FIG. 32. It is noted herein that the same elements as constituent elements of the capacitance element shown in FIG. 20 to FIG. 28 according to the fourth embodiment are denoted by the same reference numerals to omit a description thereof.

As shown in FIG. 32, the capacitance element according to this embodiment is characterized in that, as compared with the capacitance element shown in FIG. 20 according to the fourth embodiment, instead of the polysilicon dummy layer 14 formed on the periphery of the capacitance element for making a level difference a polysilicon dummy layer 34 having the same thickness of, e.g. 100 to 500 nm or so for making a level difference is formed on the periphery of the capacitance element.

Moreover, it is also characterized in that, instead of the lower electrode 18a made of, e.g. TiN/Al—Si/Ti/TiON/Ti and having a recess form section shown in FIG. 20 according to the fourth embodiment, a flat lower electrode 18b made of, e.g. TiN/Al—Si/Ti/TiON/Ti is formed and also, separately from the lower electrode 18b, a dummy electrode 18c made of, e.g. TiN/Al—Si/Ti/TiON/Ti having a higher surface than that of the upper electrode 22 is formed over the polysilicon dummy layer 34 for making a level difference surrounding the capacitance element.

The other components are approximately the same as those of the fourth embodiment.

Next, a method of fabricating the capacitance element shown in FIG. 32 will be described with reference to schematic sectional process diagrams of FIG. 32 to FIG. 38.

Figure 33:
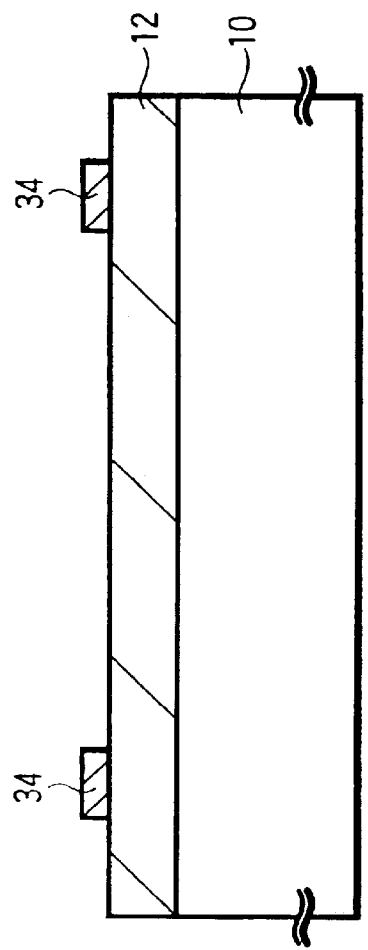
FIG. 33 is a schematic sectional process diagram (No.1) for explaining the method of fabricating the capacitance element shown in FIG. 32.

To begin with, as shown in FIG. 33, after the first insulation film 12 made of, e.g. a SiO$_2$ film is formed on the semiconductor substrate 10, a polysilicon layer is formed further on the first insulation film 12 up to a predetermined thickness of, e.g. 100 to 500 nm or so.

Subsequently, through the photolithographing process and RIE process, the polysilicon layer is selectively removed by etching into a predetermined pattern.

In this way, a polysilicon dummy layer 34 made of a polysilicon layer having a thickness of 100 to 500 nm or so for making a level difference is formed on the periphery of a predefined area of forming the capacitance element on the semiconductor substrate 10 through the first insulation film 12.

Additionally, the forming process of the polysilicon dummy layer 34 can be combined with a forming process of a polysilicon layer used as a gate electrode of the other element, e.g. MOSTr, a resistance layer of a resistance element or an electrode of BipTr in LSI.

Figure 34:
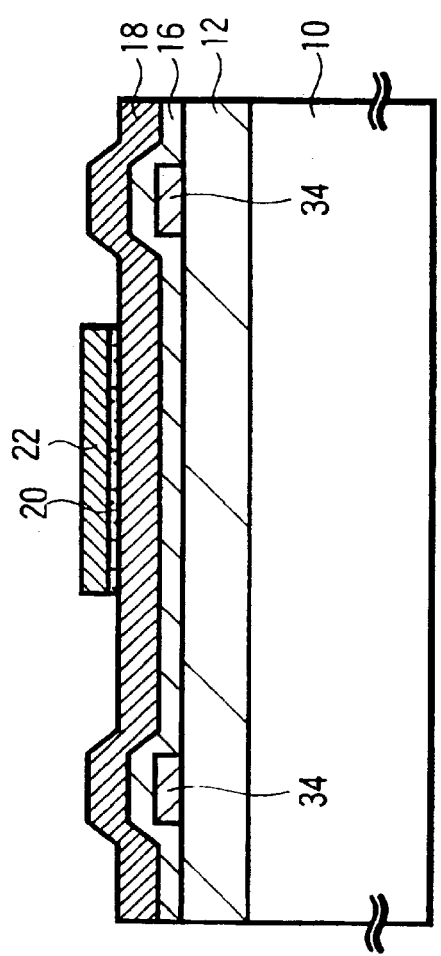
FIG. 34 is a schematic sectional process diagram (No.2) for explaining the method of fabricating the capacitance element shown in FIG. 32.

Next, as shown in FIG. 34, in the same way as processes shown in FIG. 22 to FIG. 24 according to the fourth embodiment, the second insulation film 16 is formed on the whole surface of base body including the polysilicon dummy layer 34 for making a level difference. This insulation film 16 can be dispensed with. Then, on the second insulation film 16 is formed a TiN/Al—Si/Ti/TiON/Ti lamination film or a layered film of Cu, Al—Cu and the like, in this embodiment a TiN/Al—Si/Ti/TiON/Ti lamination film 18. On this TiN/Al—Si/Ti/TiON/Ti lamination film 18 is formed an upper electrode 22 made of a Ti film, a TiN film or a Ti/TiN layered film through a dielectric film 20 of Ta$_2$O$_5$, SiO$_2$, SiN or the like, in this embodiment Ta$_2$O$_5$.

Note that the surface of the dielectric film 20 at this moment is lower in height than the top surface of the TiN/Al—Si/Ti/TiON/Ti lamination film 18 located over the polysilicon dummy layer 34.

Next, as shown in FIG. 35, through the photolithographing process and RIE process, the TiN/Al—Si/Ti/TiON/Ti lamination film 18 is selectively removed by etching into a predetermined pattern.

In this manner, the lower electrode 18b made of TiN/Al—Si/Ti/TiON/Ti is formed in the predefined area of forming the capacitance element on the second insulation film 16 and also, separately from the lower electrode 18b, the dummy electrode 18c of TiN/Al—Si/Ti/TiON/Ti having the top surface higher than the surface of lower electrode 18b is formed over the polysilicon dummy layer 34 surrounding the predefined area of forming the capacitance element.

Simultaneously with the formation of lower electrode 18b, lower-layer wiring layers (not shown) made of a TiN/Al—Si/Ti/TiON/Ti lamination film of other elements in LSI are formed.

The capacitance element is thus formed, which is comprised of the upper electrode 22 and lower electrode 18b sandwiching the dielectric film 20 between them.

Note that the surface of the dielectric film 20 at this time is lower in height than the top surface of the dummy electrode 18c surrounding the predefined area of forming the capacitance element and located over the polysilicon dummy layer 34.

Next, as shown in FIG. 36, on the whole surface of base body including the upper electrode 22 and lower electrode 18b is piled a SiO$_2$ film up to a thickness of 300 to 1500 nm or so. This SiO$_2$ film is further coated with a SOG film. Thereafter, there SOG film and SiO$_2$ film are processed to be smoothed by etching back.

In this way, the recess surrounded by the dummy electrode 18c is filled and smoothed to form the smoothing insulation film 24.

In this process of smoothing the whole surface of base body, namely, the process of forming the smoothing insulation film 24, the surface of dielectric film 20 formed on the lower electrode 18b is lower in level than the top surface of dummy electrode 18c surrounding the predefined area of forming the capacitance element and located over the polysilicon dummy layer 34, Under a normal etch-back condition, there is not a large difference between an etching rate of Ti or TiN and that of $SiO_2$. Thus, when the SOG film and $SiO_2$ film are etched back, the surface of dielectric film 20 will never be exposed by etching.

Figure 37:
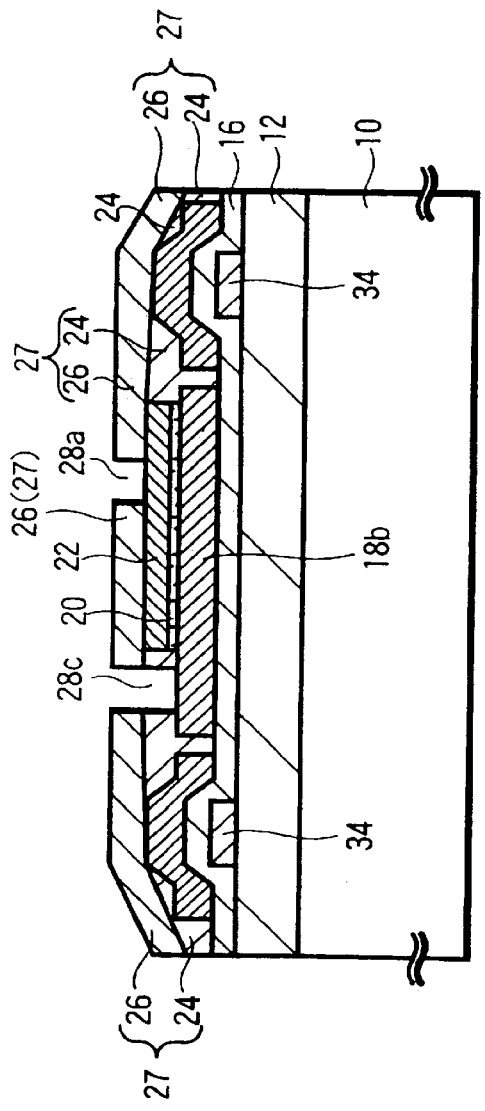
FIG. 37 is a schematic sectional process diagram (No.5) for explaining the method of fabricating the capacitance element shown in FIG. 32.

Next, as shown in FIG. 37, using the plasma CVD method for example, on the whole surface of base body including the dummy electrode 18c and smoothing insulation film 24 is piled the insulation film 26. The smoothing insulation film 24 and insulation film 26 make the inter-layer insulation film 27 together.

Subsequently, using the photolithographing process and dry etching method, the inter-layer insulation film 27 on the upper electrode 22 and lower electrode 18b is selectively removed by etching to open the first and second via-holes 28a and 28b.

Figure 38:
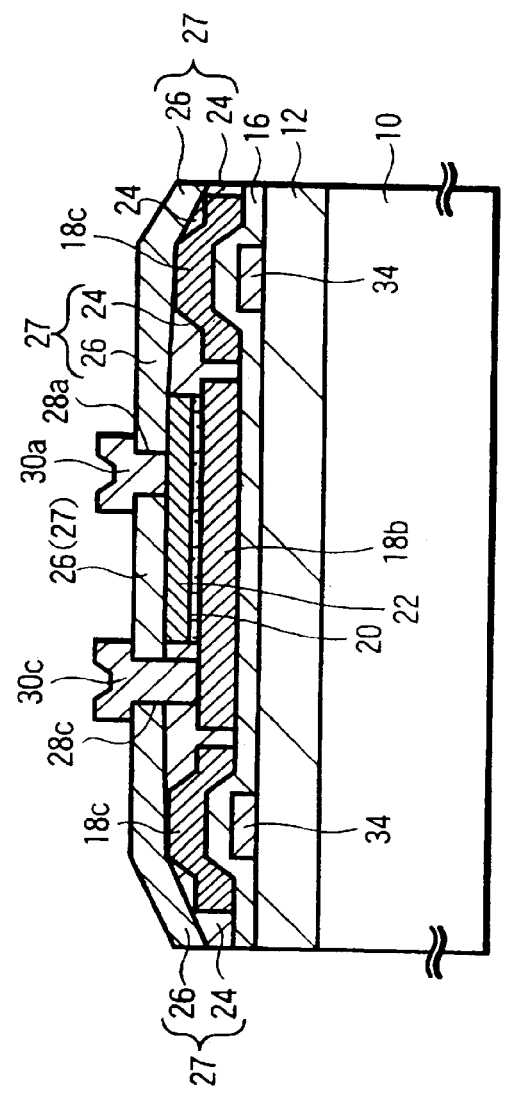
FIG. 38 is a schematic sectional process diagram (No.6) for explaining the method of fabricating the capacitance element shown in FIG. 32.
Figure 39:
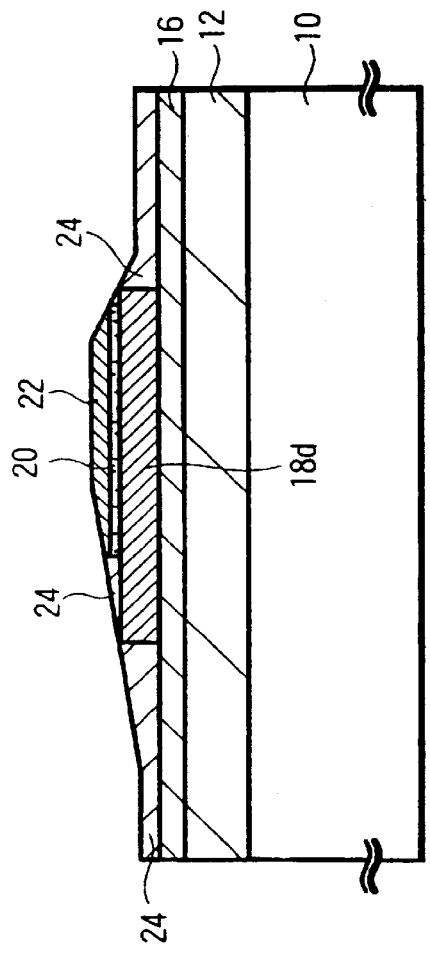
FIG. 39 is a schematic sectional process diagram (No.1) for explaining a conventional method of fabricating a capacitance element.
Figure 40:
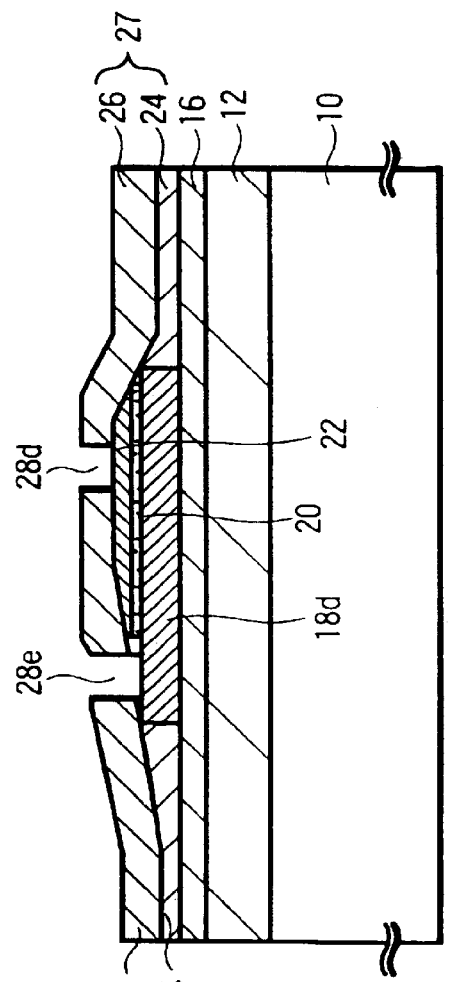
FIG. 40 is a schematic sectional process diagram (No.2) for explaining the conventional method of fabricating a capacitance element.
Figure 41:
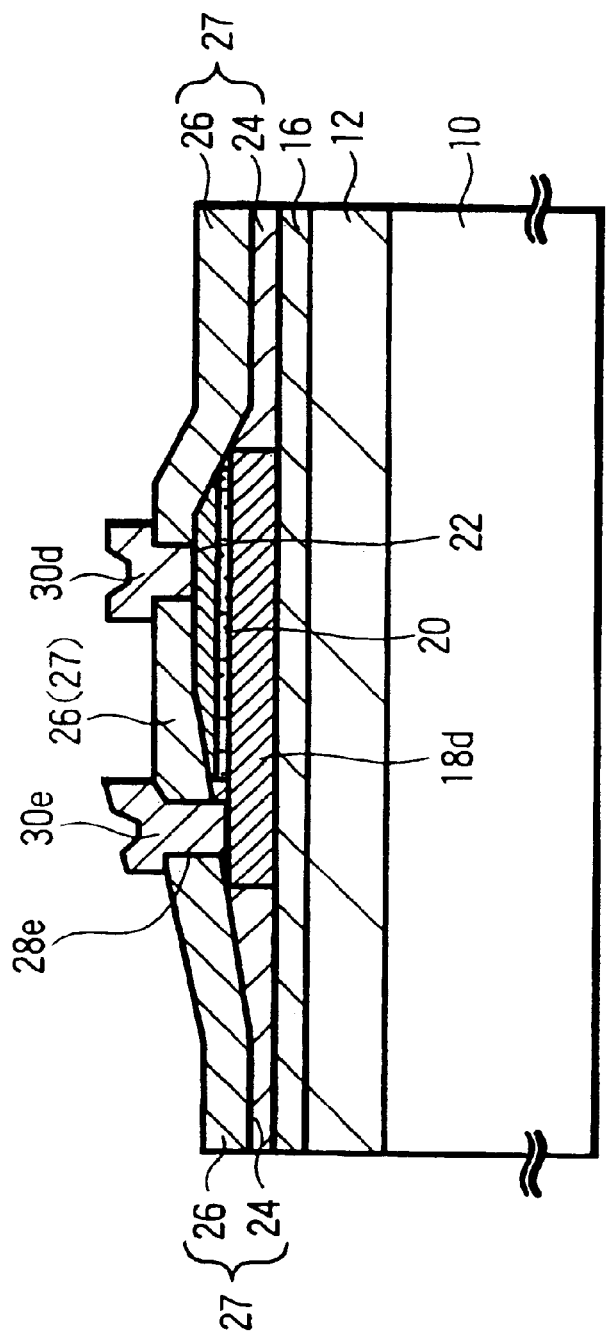
FIG. 41 is a schematic sectional process diagram (No.3) for explaining the conventional method of fabricating a capacitance element.

Next, as shown in FIG. 38, after an Al-alloy layer is piled using the sputtering method for example the Al-alloy layer is processed using the photolithographing process and dry etching method to form the first and second upper-layer wiring layers 30a and 30c made of Al-alloy layer and each connected to the upper electrode 22 and the periphery of lower electrode 18b through the first and second via-holes 28a and 28c.

Simultaneously with the formation of the first and second upper-layer wiring layers 30a and 30c, upper layer wiring layers (not shown) of other elements in LSI are formed.

As described above, in this embodiment, the polysilicon dummy layer 34 having a thickness of about 100 to 500 nm for making a level difference is formed on the periphery of a predefined area of forming the capacitance element on the semiconductor substrate 10 through the first insulation film 12; the lamination film 18 of, e.g. TiN/Al—Si/Ti/TiON/Ti being formed on the whole surface of base body including the polysilicon dummy layer 34 through the second insulation film 16 and patterned into a predetermined shape; the lower electrode 18b of TiN/Al—Si/Ti/TiON/Ti being formed in the predefined area of forming the capacitance element; the dummy electrode 18c of TiN/Al—Si/Ti/TiON/Ti having the surface higher than the surface of lower electrode 18b being formed above the polysilicon dummy layer 34 surrounding the lower electrode 18b; the upper electrode 22 being formed on the lower electrode 18b through the dielectric film 20; and the surface of dielectric film 20 is made lower in height than the top surface of dummy electrode 18c formed above the polysilicon dummy layer 34. Thus, when the smoothing process is performed by etching back after a $SiO_2$ film is piled on the whole surface of base body and further coated with a SOG film, the dummy electrode 18c acts as an etching stopper and so the dielectric film 20 under the upper electrode 22 will never sustain damage by etching. Therefore, similarly to the fourth embodiment, it is possible to suppress the fluctuation in characteristics, such as a capacitance value or the like and the deterioration of reliability on a capacitance element, thereby allowing a capacitance element having satisfactory characteristics and high reliability to be obtained.

Additionally, in the fourth to sixth embodiments, there is described the case where the lower electrode 18a or 18b is connected to the second upper-layer wiring layer 30b or 30c through the second via-hole 28b or 28c. However, there may be a case where the lower electrode 18a or 18b also serves as a wiring layer intactly and is connected to another element of LSI.

In this case, it is unnecessary to selectively remove the inter-layer insulation film 27 on the lower electrode 18a or 18b by etching so as to open the second via-hole 28b or 28c.

Moreover, in order to form the first and second upper-layer wiring layers 30a, 30b and 30c, the following method can be employed instead of piling the Al-alloy layer and processing the same. After a W(tungsten) layer is piled using the CVD method, W plugs which respectively fill the first and second via-holes 28a, 28b and 28c are formed by etching back. Further, using the sputtering method is piled an Al-alloy layer. Thereafter, the Al-alloy layer is processed to form the first and second upper-layer wiring layers which are connected to the W plugs inside the first and second via-holes 28a 28b and 28c, respectively.

What is claimed is:

1. A semiconductor device characterized by comprising: a lower electrode that is formed on a semiconductor substrate through a first insulation film and has a recess form section in which the surface of its periphery lies on a higher level than the surface of its center; an upper electrode that is formed on the center of the lower electrode through a dielectric film, the surface of which lies on a lower level than the surface of the periphery of the lower electrode; and a second insulation film that fills a recess of the lower electrode having the recess form section.

2. A semiconductor device according to claim 1, characterized in that: a third insulation film is formed on the periphery of the lower electrode, the upper electrode and the second insulation film to make an inter-layer insulation film; a first wiring layer that is connected to the upper electrode through a first via-hole opened in the inter-layer insulation film; and a second wiring layer that is connected to the periphery of the lower electrode through a second via-hole opened in the inter-layer insulation film.

3. A semiconductor device according to claim 1, characterized in that a dummy layer provided below the periphery of the lower electrode for making a level difference is formed out of a layer of the same material as that of an electrode or a resistance layer of another element.

4. A semiconductor device according to claim 2, characterized in that a dummy layer provided below the periphery of the lower electrode for making a level difference is formed out of a layer of the same material as that of an electrode or a resistance layer of another element.

5. A semiconductor device characterized by comprising: a lower electrode formed on a semiconductor substrate through a first insulation film; a dummy electrode having the surface higher than the surface of the lower electrode; an upper electrode formed on the lower electrode through a dielectric film, the surface of which lies on a level lower than the top surface of the dummy electrode; and a second insulation film that fills a recess surrounded by the dummy electrode.

6. A semiconductor device according to claim 5, characterized in that: a third insulation film is formed on the dummy electrode, the upper electrode and the second insulation film to make an inter-layer insulation film; a first wiring layer that is connected to the upper electrode through a first via-hole opened in the inter-layer insulation film; and a second wiring layer that is connected to the lower electrode through a second via-hole opened in the inter-layer insulation film.

7. A semiconductor device according to claim 5, characterized in that a dummy layer provided below the dummy electrode for making a level difference is formed out of a layer of the same material as that of an electrode or a resistance layer of another element.

8. A semiconductor device according to claim 5, characterized in that a dummy layer provided below the dummy electrode for making a level difference is formed out of a layer of the same material as that of an electrode or a resistance layer of another element.

9. A semiconductor device characterized by comprising: a lower electrode that is formed on a semiconductor substrate through a first insulation film and has a recess form section in which the surface of its periphery lies on a level higher than the surface of its center; an upper electrode that is formed on the center of the lower electrode through a dielectric film and has the surface lower in level than the surface of the periphery of the lower electrode; and a second insulation film that fills a recess of the lower electrode having a recess form section and also covers the surface of the upper electrode.

10. A semiconductor device according to claim 9, characterized in that: a third insulation film is formed on the periphery of the lower electrode and the second insulation film to make an inter-layer insulation film; a first wiring layer that is connected to the upper electrode through a first via-hole opened in the inter-layer insulation film; and a second wiring layer that is connected to the periphery of the lower electrode through a second via-hole opened in the inter-layer insulation film.

11. A semiconductor device according to claim 9, characterized in that a dummy layer provided below the periphery of the lower electrode for making a level difference is formed out of a layer of the same material as that of an electrode or a resistance layer of another element.

12. A semiconductor device according to claim 10, characterized in that a dummy layer provided below the periphery of the lower electrode for making a level difference is formed out of a layer of the same material as that of an electrode or a resistance layer of another element.

13. A semiconductor device characterized by comprising: a lower electrode formed on a semiconductor substrate through a first insulation film; a dummy electrode that is formed on the periphery of the lower electrode and has the surface higher in level than the surface of the lower electrode; an upper electrode that is formed on the lower electrode through a dielectric film and has the surface lower in level than the top surface of the dummy electrode; and a second insulation film that fills a recess surrounded by the dummy electrode and also covers the surface of the lower electrode and upper electrode.

14. A semiconductor device according to claim 13, characterized in that: a third insulation film is formed on the dummy electrode, the upper electrode and the second insulation film to make an inter-layer insulation film; a first wiring layer that is connected to the upper electrode through a first via-hole opened in the inter-layer insulation film; and a second wiring layer that is connected to the lower electrode through a second via-hole opened in the inter-layer insulation film.

15. A semiconductor device according to claim 13, characterized in that the dummy layer provided below the dummy electrode for making a level difference is formed out of a layer of the same material as that of an electrode or a resistance layer of another element.

16. A semiconductor device according to claim 14, characterized in that the dummy layer provided below the dummy electrode for making a level difference is formed out of a layer of the same material as that of an electrode or a resistance layer of another element.

17. A method of fabricating a semiconductor device characterized by comprising the steps of: forming a dummy layer having a predetermined thickness for making a level difference on the periphery of a predefined area of forming a capacitance element on a semiconductor substrate through a first insulation film; forming a lower electrode that has a recess form section in which the surface of its periphery lies on a level higher than the surface of its center, on the predefined area of forming the capacitance element, by piling a conductor film on the first insulation film and the dummy layer and then patterning the conductor film; forming an upper electrode on the center of the lower electrode through a dielectric film, the surface of which lies on a level lower than the surface of the periphery of the lower electrode; and forming a second insulation film on the whole surface of a base body to fill a recess of the lower electrode having the recess form section.

18. A method of fabricating a semiconductor device according to claim 17, characterized by further comprising the steps of: forming a third insulation film on the whole surface of the base body including the periphery of the lower electrode, the upper electrode and the second insulation film to make an inter-layer insulation film; opening a first via-hole in the inter-layer insulation film on the upper electrode and also opening a second via-hole in the inter-layer insulation film on the periphery of the lower electrode; and forming a first wiring layer that is connected to the upper electrode through the first via-hole and also forming a second wiring layer that is connected to the periphery of the lower electrode through the second via-hole.

19. A method of fabricating a semiconductor device according to claim 17, characterized in that the step of forming the dummy layer for making a level difference is combined with a step of forming an electrode or a resistance layer of another element.

20. A method of fabricating a semiconductor device according to claim 18, characterized in that the step of forming the dummy layer for making a level difference is combined with a step of forming an electrode or a resistance layer of another element.

21. A method of fabricating a semiconductor device characterized by comprising the steps of: forming a dummy layer having a predetermined thickness for making a level difference, around a predefined area of forming a capacitance element on a semiconductor substrate through a first insulation film; forming a lower electrode in the predefined area of forming a capacitance element by piling a conductor film on the first insulation film and the dummy layer, thereafter patterning the conductor film, and also forming a dummy electrode that covers the dummy layer and has the surface higher than the surface of the lower electrode, around the predefined area of forming a capacitance element; forming an upper electrode on the lower electrode through a dielectric film, the surface of which lies on a level lower than the top surface of the dummy electrode; and forming a second insulation film on the whole surface of a base body to fill a recess surrounded by the dummy electrode.

22. A method of fabricating a semiconductor device according to claim 21, characterized by further comprising the steps of: forming a third insulation film on the whole surface of the base body including the dummy electrode, the upper electrode and the second insulation film to make an inter-layer insulation film; opening a first via-hole in the inter-layer insulation film on the upper electrode and also opening a second via-hole in the inter-layer insulation film on the lower electrode; and forming a first wiring layer that is connected to the upper electrode through the first via-hole and also forming a second wiring layer that is connected to the lower electrode through the second via-hole.

23. A method of fabricating a semiconductor device according to claim 21, characterized in that the step of forming the dummy layer for making a level difference is combined with a step of forming an electrode or a resistance layer of another element.

24. A method of fabricating a semiconductor device according to claim 22, characterized in that the step of forming the dummy layer for making a level difference is combined with a step of forming an electrode or a resistance layer of another element.

25. A method of fabricating a semiconductor device characterized by comprising the steps of: forming a dummy layer having a predetermined thickness for making a level difference on the periphery of a predefined area of forming a capacitance element on a semiconductor substrate through a first insulation film; forming a lower electrode having a recess form section in which the surface of its periphery lies on a level higher than the surface of its center, in a predefined area of forming a capacitance element, by piling a conductor film on the first insulation film and the dummy layer and then patterning the conductor film; foaming an upper electrode, the surface of which lies on a level lower than the surface of the periphery of the lower electrode, on the center of the lower electrode through a dielectric film; and forming a second insulation film on the whole surface of a base body to fill a recess of the lower electrode having a recess form section and also cover the surface of the upper electrode.

26. A method of fabricating a semiconductor device according to claim 25, characterized by further comprising the steps of: forming a third insulation film on the whole surface of the base body including the periphery of the lower electrode and the second insulation film to make an inter-layer insulation film; opening a first via-hole in the inter layer insulation film on the upper electrode and also opening a second via-hole in the inter-layer insulation film on the periphery of the lower electrode; and forming a first wiring layer that is connected to the upper electrode through the first via-hole and also forming a second wiring layer that is connected to the periphery of the lower electrode through the second via-hole.

27. A method of fabricating a semiconductor device according to claim 25, characterized in that the step of forming the dummy layer for making a level difference is combined with a step of forming an electrode or a resistance layer of another element.

28. A method of fabricating a semiconductor device according to claim 26, characterized in that the step of forming the dummy layer for making a level difference is combined with a step of forming an electrode or a resistance layer of another element.

29. A method of fabricating a semiconductor device characterized by comprising the steps of: forming a dummy layer having a predetermined thickness for making a level difference around a predefined area of forming a capacitance element on a semiconductor substrate through a first insulation film; forming a lower electrode in the predefined area of forming a capacitance element by piling a conductor film on the first insulation film and the dummy layer, thereafter patterning the conductor film, and also forming a dummy electrode that covers the dummy layer and has the surface higher than the surface of the lower electrode, around the predefined area of forming a capacitance element; forming an upper electrode, the surface of which lies on a level lower than the top surface of the dummy electrode, on the lower electrode through a dielectric film; and forming a second insulation film on the whole surface of a base body to fill a recess surrounded by the dummy electrode and also cover the surface of the lower electrode and upper electrode.

30. A method of fabricating a semiconductor device according to claim 29, characterized by further comprising the steps of: forming a third insulation film on the whole surface of the base body including the dummy electrode and the second insulation film to make an inter-layer insulation film opening a first via-hole in the inter-layer insulation film on the upper electrode and also opening a second via-hole in the inter-layer insulation film on the lower electrode; and forming a first wiring layer that is connected to the upper electrode through the first via-hole and also forming a second wiring layer that is connected to the lower electrode through the second via-hole.

31. A method of fabricating a semiconductor device according to claim 29, characterized in that the step of forming the dummy layer for making a level difference is combined with a step of an electrode and a resistance layer of another element.

32. A method of fabricating a semiconductor device according to claim 30, characterized in that the step of forming the dummy layer for making a level difference is combined with a step of forming an electrode or a resistance layer of another element.

* * * * *